United States Patent
Shin et al.

(10) Patent No.: US 11,062,776 B2
(45) Date of Patent: Jul. 13, 2021

(54) NONVOLATILE MEMORY DEVICE AND MEMORY SYSTEM INCLUDING THEREOF

(71) Applicant: SAMSUNG ELECTRONICS CO., LTD., Suwon-si (KR)

(72) Inventors: Hyun-Jin Shin, Hwaseong-si (KR); Ji-Sung Kim, Seoul (KR); Ho Young Shin, Gunpo-si (KR); Myeong Hee Oh, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/731,288

(22) Filed: Dec. 31, 2019

(65) Prior Publication Data

US 2020/0411104 A1 Dec. 31, 2020

(30) Foreign Application Priority Data

Jun. 28, 2019 (KR) .......................... 10-2019-0078128

(51) Int. Cl.
*G11C 5/14* (2006.01)
*G11C 16/12* (2006.01)
*G11C 16/30* (2006.01)

(52) U.S. Cl.
CPC .............. *G11C 16/12* (2013.01); *G11C 5/145* (2013.01); *G11C 16/30* (2013.01)

(58) Field of Classification Search
CPC .......... G11C 16/12; G11C 5/145; G11C 16/30
USPC .................................................... 365/189.09
See application file for complete search history.

(56) References Cited

U.S. PATENT DOCUMENTS

| 6,194,954 | B1 | 2/2001 | Kim et al. |
| 7,847,620 | B2 | 12/2010 | Kim et al. |
| 10,283,207 | B2 * | 5/2019 | Shin ........................ G11C 16/30 |
| 2003/0149914 | A1 * | 8/2003 | Kim ..................... G06K 19/073 714/30 |
| 2008/0157730 | A1 | 7/2008 | Kim et al. |
| 2012/0243319 | A1 | 9/2012 | Kasai et al. |
| 2014/0204680 | A1 * | 7/2014 | Kim ........................ G11C 16/30 365/185.21 |
| 2017/0352428 | A1 | 12/2017 | Shin et al. |

FOREIGN PATENT DOCUMENTS

| KR | 10-2000-0007309 A | 2/2000 |
| KR | 10-2012-0139070 A | 12/2011 |

* cited by examiner

*Primary Examiner* — Huan Hoang
(74) *Attorney, Agent, or Firm* — Lee IP Law, PC

(57) ABSTRACT

A nonvolatile memory device includes a memory cell array including a plurality of memory cells that are programmed based on a high voltage, a high voltage generator to generate the high voltage by boosting an input voltage based on a pumping clock, a pumping clock generator to generate the pumping clock, a high voltage detector to generate a detection signal by comparing an adjustment voltage with a reference voltage, a programming current controller to adjust a programming current flowing through each of selected memory cells of the plurality of memory cells; and a control logic to adjust a frequency of the pumping clock and a current driving capability of the programming current based on the detection signal during a programming period with respect to the selected memory cells. The detection signal includes information indicating whether the high voltage reaches to a target voltage.

18 Claims, 22 Drawing Sheets

NONVOLATILE MEMORY DEVICE AND MEMORY SYSTEM INCLUDING THEREOF

CROSS-REFERENCE TO RELATED APPLICATION

Korean Patent Application No. 10-2019-0078128, filed on Jun. 28, 2019, in the Korean Intellectual Property Office, and entitled: "Nonvolatile Memory Device and Memory System Including Thereof," is incorporated by reference herein in its entirety.

BACKGROUND

1. Field

Embodiments relate to a semiconductor device, and more particularly, to a nonvolatile memory device including a high voltage generator for generating high voltage by boosting input voltage and a memory system including the nonvolatile memory device.

2. Description of the Related Art

Nonvolatile semiconductor memory devices with high-density and mass-capacity have been demanded. The Nonvolatile semiconductor memory devices may include, e.g., a flash memory used in a portable electronic device or the like. In particular, a nonvolatile device with ability of random access and enhanced performance has been researched and developed. For example, such a nonvolatile device may include, e.g., a Ferroelectric RAM (FRAM), a Magnetic RAM (MRAM), a Phase change RAM (PRAM), and a Resistive RAM (RRAM) or the like. Further, such a nonvolatile memory device may require a high voltage to perform writing operations thereof. Thus, a high voltage generator for generating the high voltage by boosting input voltage has been demanded for the nonvolatile memory devices.

SUMMARY

Embodiments are directed to a nonvolatile memory device. The nonvolatile memory device may include a memory cell array including a plurality of memory cells that are programmed based on a high voltage; a high voltage generator to generate the high voltage by boosting an input voltage based on a pumping clock; a pumping clock generator to generate the pumping clock; a high voltage detector including a plurality of variable resistances connected to each other, the high voltage detector to generate a detection signal by comparing an adjustment voltage with a reference voltage, the adjustment voltage determined based on a resistance ratio of the plurality of variable resistances and the high voltage; a programming current controller to adjust a programming current flowing through each of selected memory cells of the plurality of memory cells; and a control logic to adjust a frequency of the pumping clock and a current driving capability of the programming current based on the detection signal during a programming period with respect to the selected memory cells. The detection signal may include information indicating whether the high voltage reaches to a target voltage.

Embodiments are directed to a nonvolatile memory device. The nonvolatile memory device may include a memory cell array including a plurality of memory cells that are programmed based on high voltage; a voltage generation circuit to apply a first high voltage generated based on a first pumping clock and a second high voltage generated based on a second pumping clock to selected memory cells among the plurality of memory cells, to output a first detection signal based on voltage levels of the first high voltage and a first reference voltage, and to output a second detection signal based on voltage levels of the second high voltage and a second reference voltage; a programming current controller to adjust a programming current flowing through each of the selected memory cells; and a control logic to adjust a frequency of each of the first and second pumping clocks and a current driving capability of the programming current based on the first and second detection signals during a programming period.

Embodiments are directed to a memory system. The memory system may include a nonvolatile memory device including a memory cell array, the memory cell array including a plurality of memory cells that are programmed based on a high voltage; and a controller to control a programming operation of the nonvolatile memory device. The nonvolatile memory device may include a high voltage generator to generate the high voltage by boosting an input voltage based on a pumping clock; a high voltage detector including a plurality of variable resistances connected to each other, the high voltage detector to generate a detection signal by comparing an adjustment voltage with a reference voltage, the adjustment voltage determined based on a resistance ratio of the variable resistances and the high voltage; a programming current controller to generate a program bias voltage for adjusting a programming current flowing through each of selected memory cells among the plurality of memory cells; and a control logic to adjust the pumping clock and the program bias voltage. The controller may control the control logic to modify a frequency of the pumping clock and a current driving capability of the programming current when the detection signal includes information indicating whether the adjustment voltage is equal to the reference voltage in a programming period.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
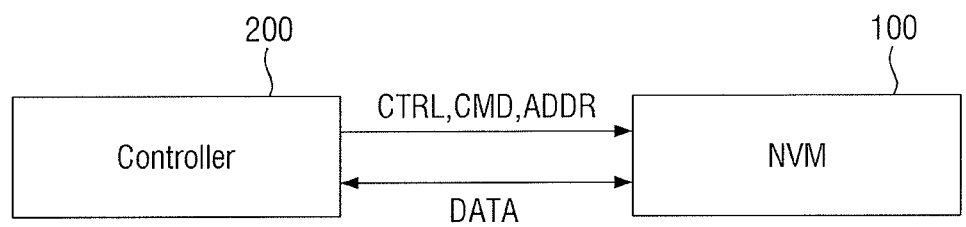
FIG. 1 illustrates a memory system according to some exemplary embodiments.

FIG. 1 illustrates a memory system according to some exemplary embodiments.

Figure 2:
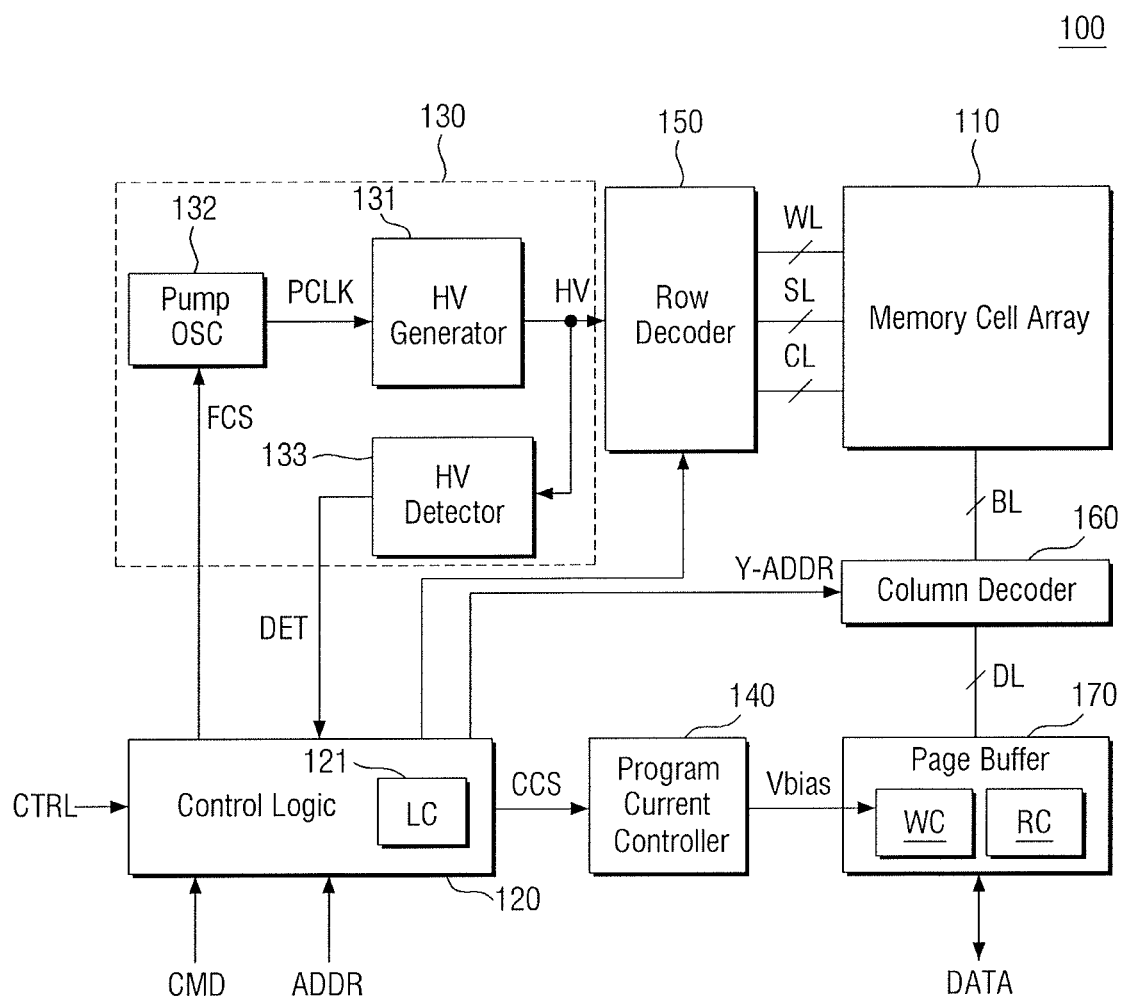
FIG. 2 illustrates a nonvolatile memory device according to some exemplary embodiments.

FIG. 2 illustrates a nonvolatile memory device according to some exemplary embodiments.

Referring to FIG. 1, the memory system 10 according to some exemplary embodiments may include a nonvolatile memory device 100 and a controller 200. The controller 200 may control a general operation of the nonvolatile memory device 100. The controller 200 may read data from the nonvolatile memory device 100 and output the read data externally. Further the controller 200 may program data in the nonvolatile memory device 100. According to some exemplary embodiments, the controller 200 may be implemented to be, e.g., a micro controller, a central processing unit (CPU) or the like.

Referring to FIG. 2, the nonvolatile memory device 100 may include a memory cell array 110, a control logic 120, a voltage generation circuit 130, a programming current controller 140, a row decoder 150, a column decoder 160, and a buffer circuit 170. For example, the nonvolatile memory device 100 may further include a data input/output circuit or an input/output interface.

The memory cell array 110 may include a plurality of memory cells. The plurality of memory cells may be programmed in a hot carrier injection (HCI) method. For example, the plurality of memory cells may be, e.g., flash memory cells. According to some exemplary embodiments, the plurality of memory cells may be NOR flash memory cells. Alternatively, the plurality of memory cells may be various types of nonvolatile memory cells. According to some exemplary embodiments, the plurality of memory cells may be NAND flash memory cells. Further, the plurality of memory cells may be resistive memory cells, e.g., a resistive RAM (RRAM), a phase change RAM (PRAM), or a magnetic RAM (MRAM).

The memory cell array 110 may be connected with word lines (WL), source lines (SL), control lines (CL), and bit lines (BL). For example, the memory cell array 110 may be connected with the row decoder 150 through the word lines (WL), the source lines (SL), and the control lines (CL), and the column decoder 160 through the bit lines (BL). According to some exemplary embodiments, the memory cell array 110 may be connected with eradication lines (EL). According to some exemplary embodiments, the memory cell array 110 may be implemented without the control lines (CL). Alternatively, a type of lines connected with the memory cell array 110 may be changed according to various structures of the memory cell array 110.

The voltage generation circuit 130 may generate various types of voltages for a programming operation, a reading operation, and an eradicating operation with respect to the memory cell array 110 under control of the control logic 120. The voltage generation circuit 130 may generate a high voltage HV for a programming operation. For example, the high voltage HV may be generated by boosting input voltage. For example, the voltage generation circuit 130 may include a high voltage generator 131 and a pumping clock generator 132.

According to some exemplary embodiments, the voltage generation circuit 130 may perform a detecting operation on the high voltage HV that is outputted to the memory cell array 110 for a programming operation, may generate detection signals (DET) as a result of the detecting operation, and may deliver the detection signals to the control logic 120. For example, the voltage generation circuit 130 may further include a high voltage detector 133.

The high voltage generator 131 may generate the high voltage HV by boosting input voltage, e.g., power voltage, during the programming operation. For example, the high voltage generator 131 may be implemented as a charge pump circuit and may boost the input voltage based on pumping clock (PCLK). According to some exemplary embodiments, the high voltage generator 131 may generate a plurality of high voltages HV. The high voltage HV may be provided to the source lines (SL) or the control lines (CL) through the row decoder 150. During the programming operation, a programming current Ip in FIG. 7 for hot carrier injection may be outputted to each of selected memory cells among a plurality of memory cells from the high voltage generator 131.

The pumping clock generator 132 may generate the pumping clock (PCLK) and provide the pumping clock (PCLK) to the high voltage generator 131. For example, the pumping clock generator 132 may include, e.g., an oscillator. The pumping clock generator 132 may receive frequency control signals (FCS) from the control logic 120 and adjust a frequency of the pumping clock (PCLK) according to the frequency control signals (FCS). For example, the pumping clock generator 132 may generate the pumping clock (PCLK) with variable frequencies. For example, the frequency of the pumping clock (PCLK) may increase or decrease by N times (N is an integer) from basic frequency according to the frequency control signals (FCS).

As the frequency of the pumping clock (PCLK) increases, a current driving capability of the high voltage generator 131 may be increased. In other words, when the frequency of the pumping clock (PCLK) is high, the high voltage generator 131 may generate high voltage with a target voltage level and a large current driving capability. For example, the high voltage generated by the high voltage generator 131 may maintain the target voltage level while supplying a large driving current (or a large load current). For example, as the frequency of the pumping clock (PCLK) increases, a current consumption of the voltage generation circuit 130 may be increased, and the current driving capability of the high voltage generator 131 may be raised. On the contrary, as the frequency of the pumping clock (PCLK) decreases, the consumption current of the voltage generation circuit 130 may be decreased, and the current driving capability of the high voltage generator 131 may be lowered. For example, when higher driving current beyond the current driving capability of the high voltage generator 131 is required, the high voltage generator 131 may not generate the high voltage with the target voltage level, i.e., the voltage level of the high voltage may be lower than the target voltage.

The high voltage detector 133 may receive the high voltage HV that is generated by the high voltage generator 131 and outputted to the memory cell array 110 through the row decoder 150, may compare the high voltage HV with a reference voltage (e.g., VREF in FIG. 3), and may output the detection signals (DET) to the control logic 120. A structure of the high voltage detector 133 will be described in detail below with reference to FIGS. 3 and 4.

The row decoder 150 may select some word lines, some source lines and some control lines among the word lines (WL), the source lines (SL) and the control lines (CL) in response to row address (X-ADDR) received from the control logic 120. The row decoder 150 may apply the high voltage HV to the selected word lines, the selected source lines or the selected control lines at the time of a programming operation, and apply a block voltage to the unselected word lines (WL), the unselected source lines (SL), and the unselected control lines (CL).

The column decoder 160 may select some bit lines among the bit lines (BL) in response to a column address (Y-ADDR) received from the control logic 120. The selected bit lines may be connected with the buffer circuit 170.

The buffer circuit 170 may be connected with the selected bit lines, write data (DATA) received from the controller 200 in the memory cell array 110, and read data (DATA) stored in the memory cell array 110 through the selected bit lines. The buffer circuit 170 may include a write circuit (WC) and a read circuit (RC). The read circuit (RC) may read data from the selected memory cells. The read circuit (RC) may include a sense amplifier.

For example, the write circuit (WC) of the buffer circuit 170 may write data in the selected memory cells. The write circuit (WC) may provide the programming current Ip to each of the selected memory cells through the selected bit lines. For example, the write circuit (WC) may write the data in the selected memory cells by generating the programming current Ip and controlling the programming current Ip to flow through each of the selected memory cells. The write circuit (WC) may adjust the current driving capability of the programming current Ip based on bias signals received from the programming current controller 140, e.g., a bias voltage (Vbias). As described above, the programming current Ip may be outputted from the high voltage generator 131 for supplying the high voltage HV to the selected memory cells.

The programming current controller 140 may receive current control signals (CCS) from the control logic 120 and adjust the programming current Ip based on the current control signals (CCS). For example, the programming current controller 140 may generate the bias signals for controlling the current driving capability of the programming current Ip, e.g., the bias voltage (Vbias), and provide the bias voltage (Vbias) to the write circuit (WC) of the buffer circuit 170. The programming current controller 140 may adjust a voltage level of the bias voltage (Vbias) according to the current control signals (CCS).

The control logic 120 may output various control signals for writing data in the memory cell array 110 or reading data from the memory cell array 110 based on a command (CMD), an address (ADDR) and control signals (CTRL) received from an external device, e.g., an external processor or the controller 200. As a result, the control logic 120 may control various operations of the nonvolatile memory device 100 in general.

Various control signals outputted from the control logic 120 may be provided to the voltage generation circuit 130, the programming current controller 140, the row decoder 150, the column decoder 160 and the buffer circuit 170. For example, the control logic 120 may provide the frequency control signals (FCS) to the pumping clock generator 132 and the current control signals (CCS) to the programming current controller 140. Further, the control logic 120 may provide a row address to the row decoder 150 and provide a column address (Y-ADDR) to the column decoder 160. For example, the control logic 120 may further provide other control signals, e.g., write enable signals (WEN) in FIG. 13, to the voltage generation circuit 130, the programming current controller 140, the row decoder 150, the column decoder 160, and the buffer circuit 170.

The control logic 120 may control the current driving capability of the programming current Ip based on the frequency of the pumping clock (PCLK) when high voltage HV is generated. As described above, the high voltage HV may be generated when the programming operation is performed, e.g., a programming period. The control logic 120 may control the frequency of the pumping clock (PCLK) to be adjusted during the programming period based on the detection signals (DET) and may simultaneously control the current driving capability of the programming current Ip to be adjusted based on the detection signals (DET). As the current driving capability of the programming current Ip varies, the current driving capability of driving current outputted from the high voltage generator 131 may vary.

The control logic 120 may set the frequency of the pumping clock (PCLK) to a low frequency in an initial step of a boosting operation, e.g., in an initial period of a programing operation, in order to decrease a peak operating current of the nonvolatile memory device 100. For example, as the current driving capability of the high voltage generator 131 is low, the current driving capability of the programming current Ip may be reduced in order to decrease the current driving capability of driving current outputted from the high voltage generator 131.

Further, the control logic 120 may adjust the frequency control signals (FCS) outputted to the pumping clock generator 132 based on the detection signals (DET) received from the high voltage detector 133. Further, the control logic 120 may adjust the current control signals (CCS) for controlling the programming current Ip applied to the memory cell during the programming operation based on the detection signals (DET).

For example, when the high voltage HV reaches to a target voltage level, the high voltage detector 133 may output the detection signals (DET) including information indicating that the high voltage HV reaches to the target voltage level. Further, the control logic 120 may increase the frequency of the pumping clock (PCLK) and the current driving capability of the programming current Ip based on the detection signals (DET). For example, the control logic 120 may control the frequency of the pumping clock (PCLK) and the current driving capability of the programming current Ip to a target frequency (Ftg) and a target current capability (Itg), respectively, e.g., based on the detection signals (DET). For example, when the current driving capability of the programming current Ip has the target current capability (Itg), the current driving capability of the programming current Ip may be able to normally and properly program the memory cell. Further, when the frequency of the pumping clock (PCLK) has the target frequency (Ftg), the high voltage generator 131 may stably generate the high voltage HV with the target voltage level while supplying the driving current corresponding to the target current capability (Itg) from the high voltage generator 131.

The target frequency (Ftg) and the target current capability (Itg) may be previously determined in consideration of a circuit characteristic of the memory cell and the high voltage generator 131. The target frequency (Ftg) and the target current capability (Itg) may be modified according to the control of a user in the nonvolatile memory device 100 or modified to be programmable according to an operating environment. For example, the control logic 120 may modify the target voltage, the target current capability (Itg), and the target frequency (Ftg) in response to the received command (CMD). Alternatively, the control logic 120 may modify the target voltage, the target current capability (Itg), and the target frequency (Ftg) according to various previously set conditions of the operating environment.

According to some exemplary embodiments, the control logic 120 may include a latch circuit 121. When the detection signals (DET) indicating that the high voltage HV reaches to a target voltage is received from the high voltage detector 133, data with respect to the detection signals (DET) may be stored in the latch circuit 121. For example, initial detection signals (DET), indicating that the high voltage HV reaches to the target voltage, may be stored in the latch circuit 121. Further, the frequency control signals (FCS) and the current control signals (CCS) may be controlled based on the initial detection signals (DET).

The control logic 120 may control the frequency of the pumping clock (PCLK) and the current driving capability of the programming current Ip by modifying values (or levels) of the frequency control signals (FCS) and the current control signals (CCS). The adjusting operation of the frequency control signals (FCS) and the current control signals (CCS) based on the detection signals (DET) will be described below with reference to FIGS. 12 to 17.

For example, as the frequency of the pumping clock (PCLK) at the initial step of the boosting operation is lowered, a peak operating current of the nonvolatile memory device 100 may be decreased. In other words, in generation of the high voltage HV, the frequency of the pumping clock (PCLK) at the initial step of the boosting operation may be lowered to reduce the peak operating current of the nonvolatile memory device 100. While, when the frequency of the pumping clock (PCLK) at the initial step of the boosting operation may be lowered, the current driving capability of the high voltage generator 131 is lowered. Thus, time consumed for generating the high voltage HV with a target voltage level by the high voltage generator 131 may be increased. Further, when the driving current of the high voltage generator 131 is greater than the current driving capability of the high voltage generator 131, the high voltage HV may not be boosted to the target voltage level.

According to some exemplary embodiments, when the nonvolatile memory device 100 and the memory system 10 including thereof may reduce the frequency of the pumping clock (PCLK) at the initial step of the boosting operation, the current driving capability of the programming current Ip may be simultaneously decreased. Thus, the high voltage HV may be boosted quickly to the target voltage level using the reduced frequency of the pumping clock (PCLK). Further, after the high voltage HV is boosted to the target voltage level, the nonvolatile memory device 100 may increase the frequency of the pumping clock (PCLK) to the target frequency (Ftg) and the current driving capability of the programming current Ip to the target current capability (Itg). The nonvolatile memory device 100 according to some exemplary embodiments may reduce a peak operating current of the nonvolatile memory device 100 and efficiently perform a programming operation by simultaneously controlling frequency of the pumping clock (PCLK) and the current driving capability of the programming current Ip when the programing operation is performed. For example, the detection signals (DET) may be generated based on whether the high voltage HV reaches to the target voltage level. Further, the frequency of the pumping clock (PCLK) and the current driving capability of the programming current Ip may be simultaneously controlled based on the detection signals (DET). Thus, a power efficiency and an operating characteristic of the nonvolatile memory device 100 may be enhanced by precisely determining and applying the required high voltage HV and the current driving capability of the programming current Ip.

Figure 3:
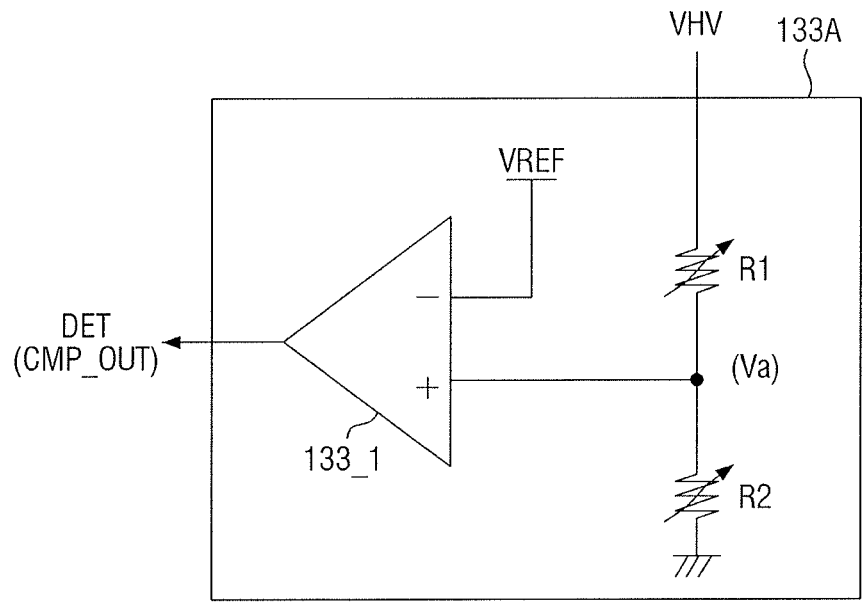
FIGS. 3 and 4 illustrate high voltage detectors according to some exemplary embodiments.
Figure 4:
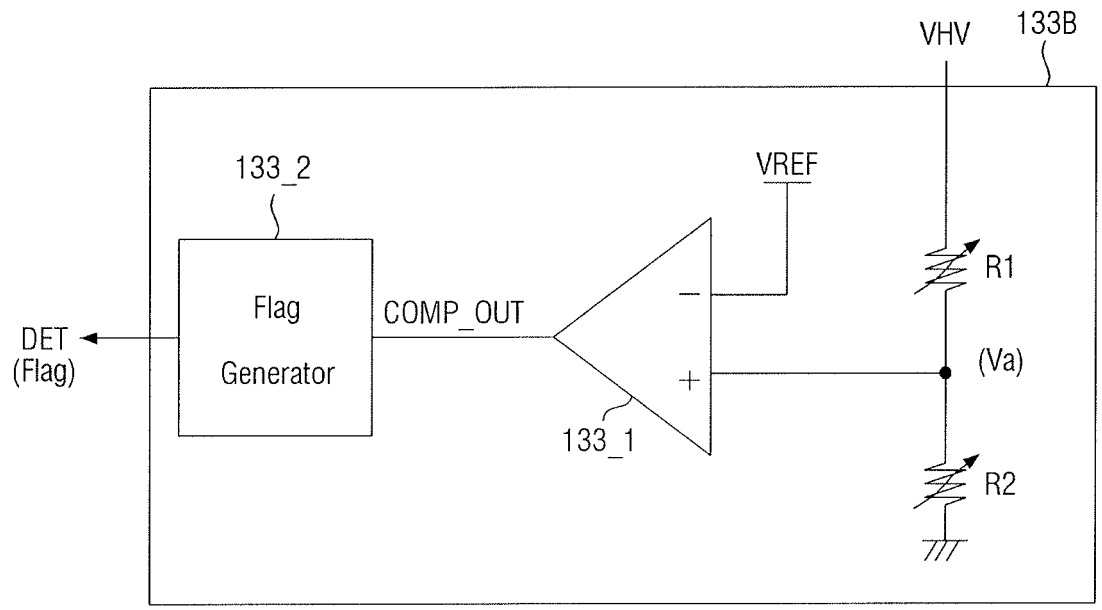

FIGS. 3 and 4 illustrate a high voltage detector according to some exemplary embodiments. Referring to FIG. 3, the high voltage detector 133A may include a comparison circuit 133_1, a first variable resistance R1 and a second variable resistance R2. The comparison circuit 133_1 may receive a reference voltage (VREF) and an adjustment voltage Va, and output a comparison result signal (CMP_OUT) as a detection signal (DET) based on relative voltage levels of the reference voltage (VREF) and the adjustment voltage Va. Further, the comparison circuit 133_1 may include a plurality of high voltage detectors. For example, the plurality of high voltage detectors may output comparison result signals (CMP_OUT) as detection signals (DET).

According to some exemplary embodiments, the first variable resistance R1 and the second variable resistance R2 may be connected with each other in serial. Thus, the adjustment voltage Va may be a voltage of a common node of the first and second variable resistances R1 and R2 based on resistance values of the first and second variable resistances R1 and R2 (e.g., as a voltage divider) and may be applied to the comparison circuit 133_1 as an input. Although FIGS. 3 and 4 illustrate that the high voltage detectors 133, 133A, 133B or the like include the two variable resistances R1 and R2, a resistor structure for each of the high voltage detectors 133, 133A, 133B or the like may be changed. For example, the adjustment voltage Va may be generated by three or more variable resistances as voltage dividers.

According to some exemplary embodiments, the comparison result signals (CMP_OUT) may be outputted to be a logic high level in a period, in which the reference voltage (VREF) is higher than the adjustment voltage Va, and may be transited to be a logic low level at a time point when the reference voltage (VREF) is same as the adjustment voltage Va. For example, at a time point when the reference voltage (VREF) is same as the adjustment voltage Va, a falling edge of the comparison result signals (CMP_OUT) may be generated. Adjustment of the frequency control signals (FCS) and the current control signals (CCS) according to the comparison result signals (CMP_OUT) will be described below with reference to FIGS. 12, 13, and 15 to 17.

Referring to FIG. 4, the high voltage detector 133B according to some exemplary embodiments may additionally include a flag generator 133_2. For example, the high voltage detector 133B may be implemented to further include the flag generator 133_2 with the comparison circuit 133_1 and the first and second variable resistances R1 and R2 described above with reference to FIG. 3.

According to some exemplary embodiments, the flag generator 133_2 may receive the comparison result signals (CMP_OUT) output from the comparison circuit 133_1, may generate a flag signal (Flag) based on the comparison result signals (CMP_OUT), and may output the flag signal (Flag) as the detection signal (DET).

According to some exemplary embodiments, the flag signal (Flag) may be generated as a 1-bit signal. For example, when the comparison result signals (CMP_OUT) are logic low (i.e., when a voltage level of the reference voltage (VREF) is higher than a voltage level of the adjustment voltage Va), the flag signal (Flag) may be generated as "0". while, when the comparison result signals (CMP_OUT) are logic high (i.e., when a voltage level of the reference voltage (VREF) is same as a voltage level of the adjustment voltage Va), the flag signal (Flag) may be generated as "1".

The control logic 120 may adjust the frequency control signals (FCS) and the current control signals (CCS) based on the flag signal (Flag) outputted as the detection signal (DET). For example, when a value of the received flag signal (Flag) is "1", the control logic may modify the frequency control signals (FCS) and the current control signals (CCS) and respectively output to the pumping clock generator 132 and the programming current controller 140. Adjustment of the frequency control signals (FCS) and the current control signals (CCS) according to the comparison result signals (CMP_OUT) will be described below with reference to FIG. 14.

Figure 5A:
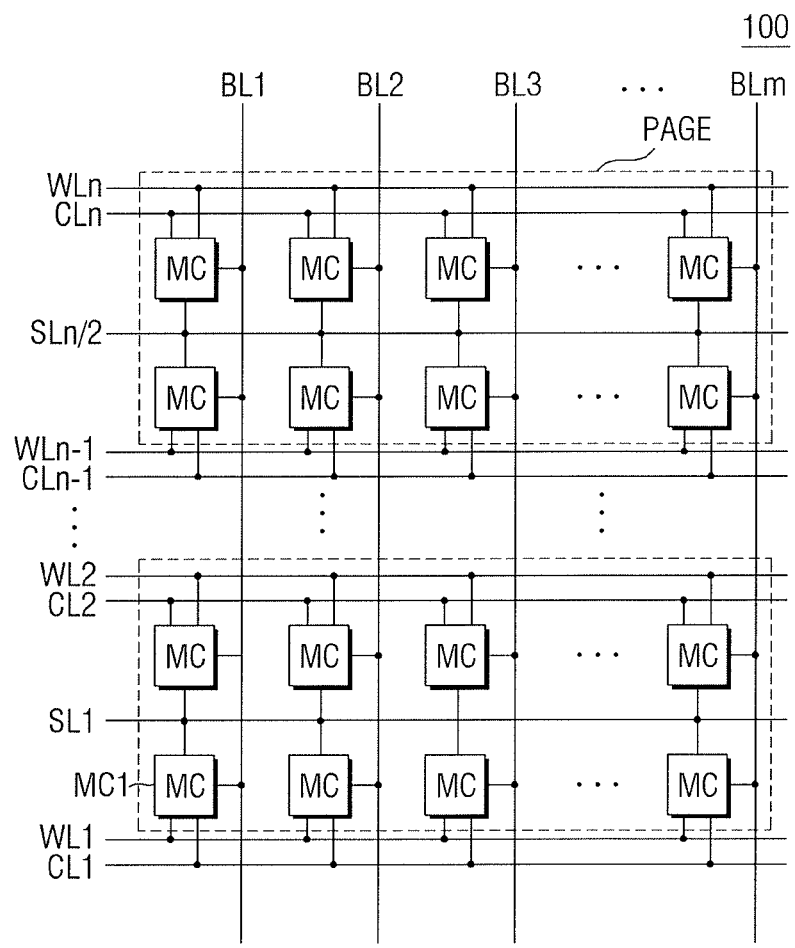
FIG. 5A illustrates a memory cell array according to some exemplary embodiments.
Figure 5B:
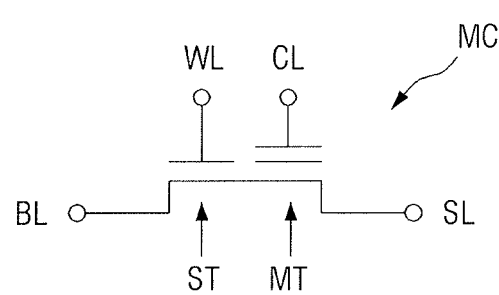
FIG. 5B illustrates an example of the memory cell in FIG. 5A.

FIG. 5A illustrates a memory cell array according to some exemplary embodiments, and FIG. 5B illustrates an example of the memory cell in FIG. 5A. Referring to FIG. 5A, the memory cell array 110 may include a plurality of memory cells MC arranged in a matrix form. The plurality of memory cells MC may be connected with word lines WL1-WLn, control lines CL1-CLn, source lines SL1-SLn, and bit lines BL1-BLn. For example, a first memory cell MC1 may be connected with the first word line WL1, the first source line SL1, the first control line CL1, and the first bit line BL1.

Although FIG. 5A illustrates that two rows of memory cells are connected with one source line, a single row of memory cells may be connected with a single source line. Further, the memory cell array 110 may additionally include eradication lines, and the plurality of memory cells MC may be connected with the eradication lines. The plurality of memory cells MC may be connected with one another in parallel. Thus, the plurality of memory cells MC may be randomly accessed to write data in the memory cell array 110 by a byte unit or word unit or to read data from the memory cell array 110. The memory cells MC connected with one source line SL1 or SLn/2 may be one page unit, and an eradicating operation may be performed by a page unit.

Referring to FIG. 5B, the memory cell MC may include a memory transistor MT and a select transistor ST connected between the source line SL and the bit line BL in series. A gate of the memory transistor MT may be connected with the control line CL. A gate of the select transistor ST may be connected with the word line WL. Further, a structure of the memory cells MC may be modified variously. For example, the memory cells MC may further include an eradication gate. The eradication gate may be connected with the eradication line.

Figure 6A:
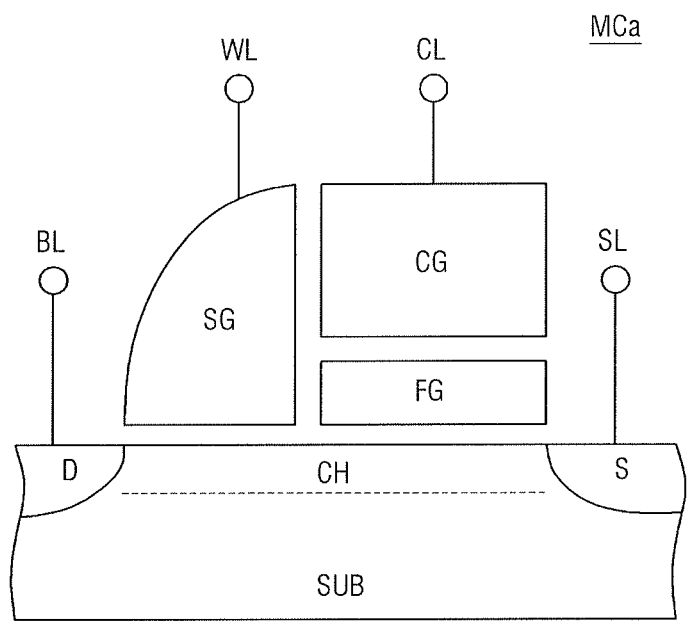
FIGS. 6A to 6C illustrate a sectioned surface of a memory cell structure according to some exemplary embodiments.
Figure 6B:
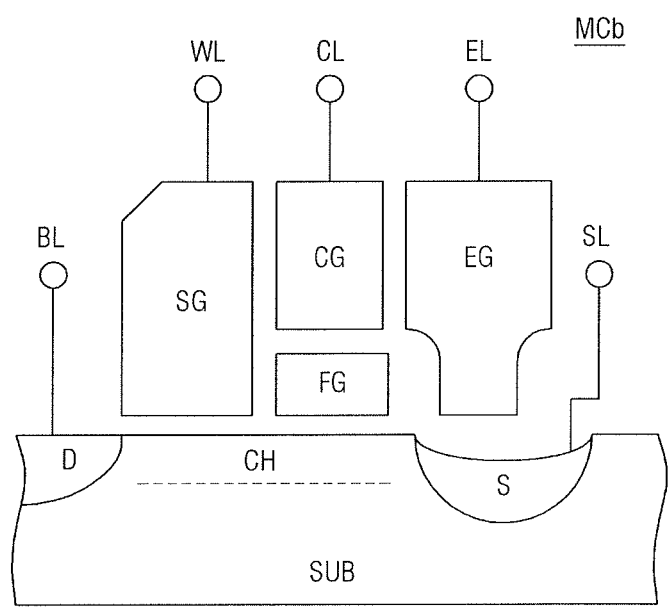
Figure 6C:
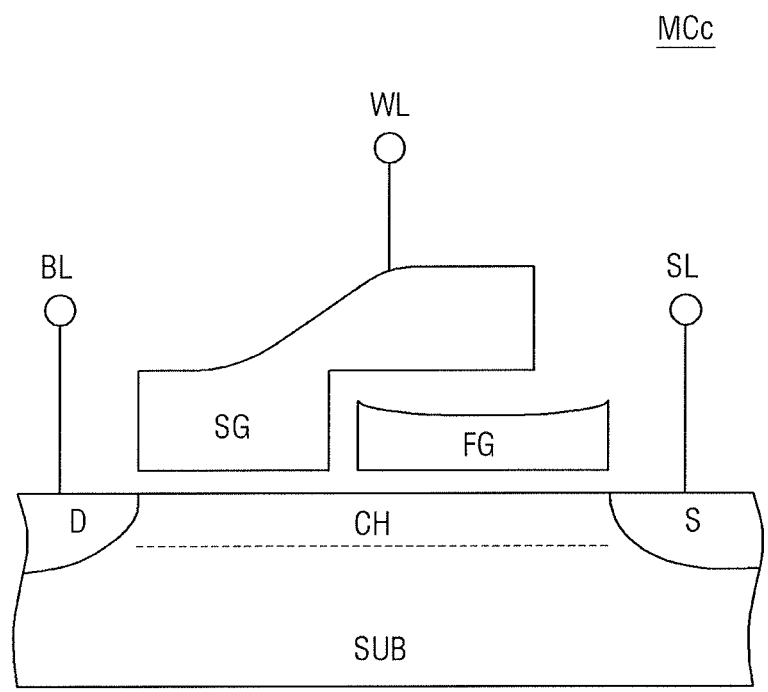

FIGS. 6A to 6C illustrate a sectioned surface of a memory cell structure according to some exemplary embodiments. Referring to FIG. 6A, a source S and a drain D may be formed on a semiconductor substrate SUB and may be spaced from each other. A channel CH may be formed between the source S and the drain D. A floating gate FG may be formed on an upper portion of a part of the channel CH. A control gate CG may be formed on an upper portion of the floating gate FG. A select gate SG may be formed on side surfaces of the floating gate FG and the control gate CG and on an upper portion of the channel CH.

Referring to FIG. 6B, the memory cell MCb in FIG. 6B may further include an eradication gate EG compared to the memory cell MCa in FIG. 6A. The eradication gate EG of the memory cells MCb may be formed on an upper portion of the source S. Further, the eradication gate EG of the memory cells MCb may be formed on an upper portion of a part of the floating gate FG.

Referring to FIG. 6C, the floating gate FG may be formed on an upper portion of the channel CH. Further, the floating gate FG may be formed on an upper portion of a part of the source S. The select gate SG (as a control gate) may be formed on the upper portion of the channel CH, one portion of the select gate SG may be adjacent to the floating gate FG in a horizontal direct and may not overlap the floating gate FG in a vertical direction. Another portion of the select gate SG may be formed on an upper portion of a part of the floating gate FG. Although the structure of the memory cells is described above with reference to FIGS. 6A to 6C, structures of the memory cell may be variously modified.

Figure 7:
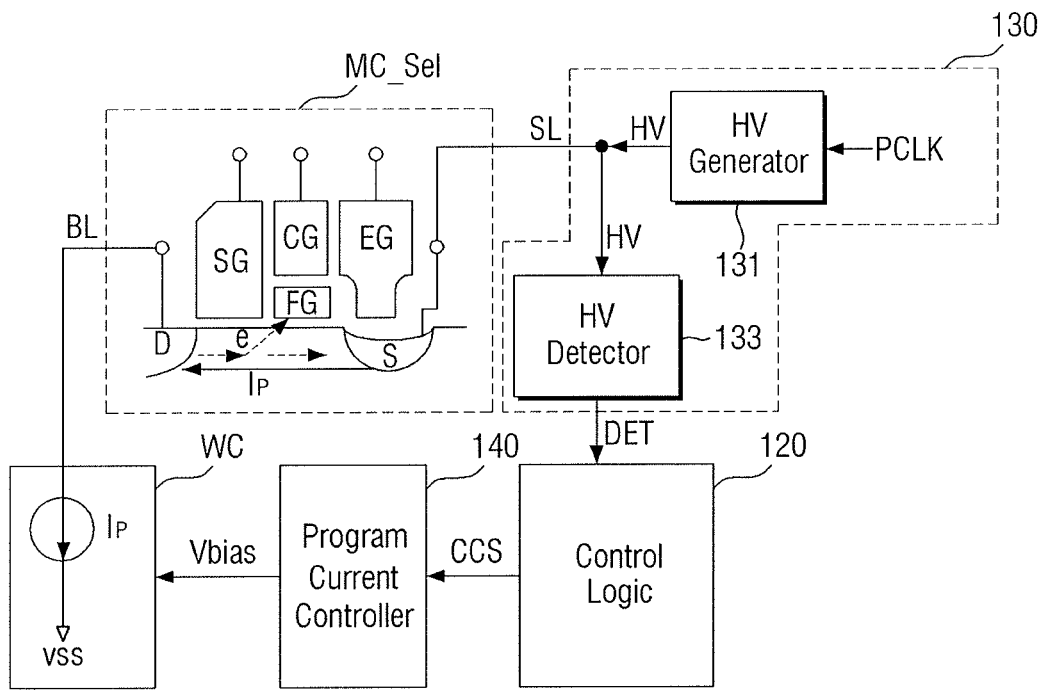
FIG. 7 illustrates an example for explaining a programming operation of a memory cell according to some exemplary embodiments.

FIG. 7 illustrates an example for explaining a programming operation of a memory cell according to some exemplary embodiments. For example, referring to FIG. 7, the high voltage HV outputted from the high voltage generator 131 may be applied to the source S of the memory cell MC_sel selected to perform a programing operation on the memory cell MC_sel. Further, the drain D of the memory cell MC_sel may be connected with the write circuit WC. The write circuit WC may generate the programming current Ip based on the bias voltage (Vbias) and sink the programming current Ip from the selected memory cell MC_sel. For example, the programming current Ip may flow from the selected memory cell MC_sel to a ground voltage VSS. Thus, the selected memory cell MC_sel may be programmed by injecting negative charge (e.g., a hot carrier) to the floating gate FG while the programming current Ip flows from the source S of the selected memory cell MC_sel to the drain D. As illustrated in FIG. 7, the programming current Ip may be outputted from the high voltage generator 131. Further, a plurality of selected memory cells MC_sel may be simultaneously programmed when the programing operation is performed.

As described above, the nonvolatile memory device 100 according to some exemplary embodiments may control the frequency of the pumping clock (PCLK) and the current driving capability of the programming current Ip so that the driving current of the high voltage generator 131 (i.e., a total current of the programming current Ip flowing through each of a plurality of the selected memory cells MC_sel) may not exceed the current driving capability of the high voltage generator 131 according to the frequency of the pumping clock (PCLK) when the programing operation is performed. For example, the high voltage detector 133 may generate the detection signals (DET) based on the high voltage HV outputted from the high voltage generator 131 and a preset reference voltage (VREF). The control logic 120 may adjust the frequency control signals (FCS) and the current control signals (CCS) based on the detection signal (DET). Thus, the pumping clock generator 132 may adjust the frequency of the pumping clock (PCLK) outputted according to the adjusted frequency control signals (FCS) such that the high voltage HV outputted from the high voltage generator 131 may be adjusted. Further, the programming current controller 140 may adjust the bias voltage (Vbias) outputted according to the adjusted current control signals (CCS) such that the programming current Ip may be adjusted.

Figure 8:
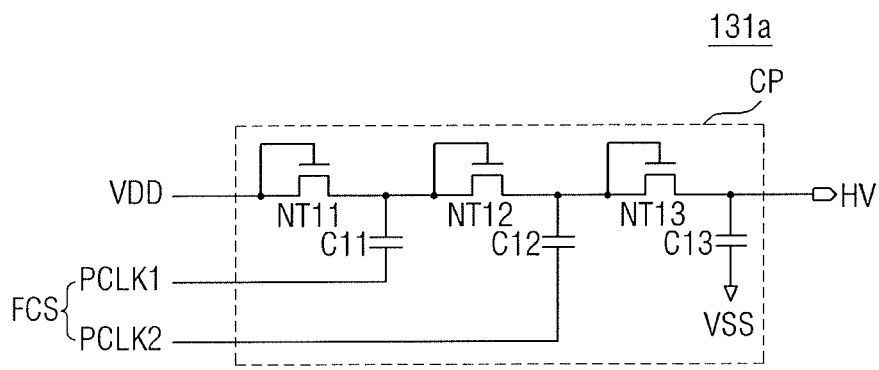
FIG. 8 illustrates a high voltage generator according to some exemplary embodiments.
Figure 9:
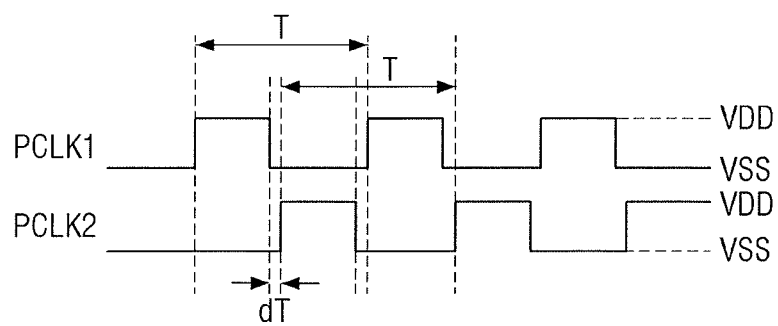
FIG. 9 illustrates waveforms of pumping clocks according to some exemplary embodiments.

FIG. 8 illustrates a high voltage generator according to some exemplary embodiments, and FIG. 9 illustrates a waveform of pumping clocks according to some exemplary embodiments. Referring to FIG. 8, the high voltage generator 131*a* may include a charge pump CP. The charge pump CP may include a plurality of transistors NT11, NT12, and NT13 and pumping capacitors NT11 and NT12. The charge pump CP may further include a stabilization capacitor C13. The number of the plurality of transistors NT11, NT12, and NT13 and the number of pumping capacitors NT11 and NT12 may vary according to the target voltage level of the high voltage HV (i.e., according to a boosting factor corresponding to a ratio of the target voltage level of the high voltage HV to a power voltage VDD).

A first pumping clock PCLK1 may be applied to a terminal of a first pumping capacitor C11. A second pumping clock PCLK2 may be applied to a terminal of a second pumping capacitor C12. The power voltage VDD may be applied to the source (or drain) of a first transistor.

Referring to FIG. 9, the first pumping clock PCLK1 and the second pumping clock PCLK2 may be transited by half of each cycle T between the power voltage VDD and the ground voltage VSS. For example, phases of the first pumping clock PCLK1 and the second pumping clock PCLK2 may be reversed to each other. According to some exemplary embodiments, one pumping clock may be transited from the ground voltage VSS to the power voltage VDD after another pumping clock is transited from the power voltage VDD to the ground voltage VSS. For example, the second pumping clock PCLK2 may be transited from the ground voltage VSS to the power voltage VDD after a certain time dT from when the first pumping clock PCLK1 is transited from the power voltage VDD to the ground voltage VSS. For example, there may be the certain time dT between a falling edge of the first pumping clock PCLK1 and a rising edge of the second pumping clock PCLK2.

Referring to FIG. 8, the high voltage HV may be generated by boosting the power voltage VDD according to a turn-on or turn-off operation of a plurality of transistors NT11, NT12, and NT13 and level changes of the first and second pumping clocks PCLK1 and PCLK2.

Figure 10:
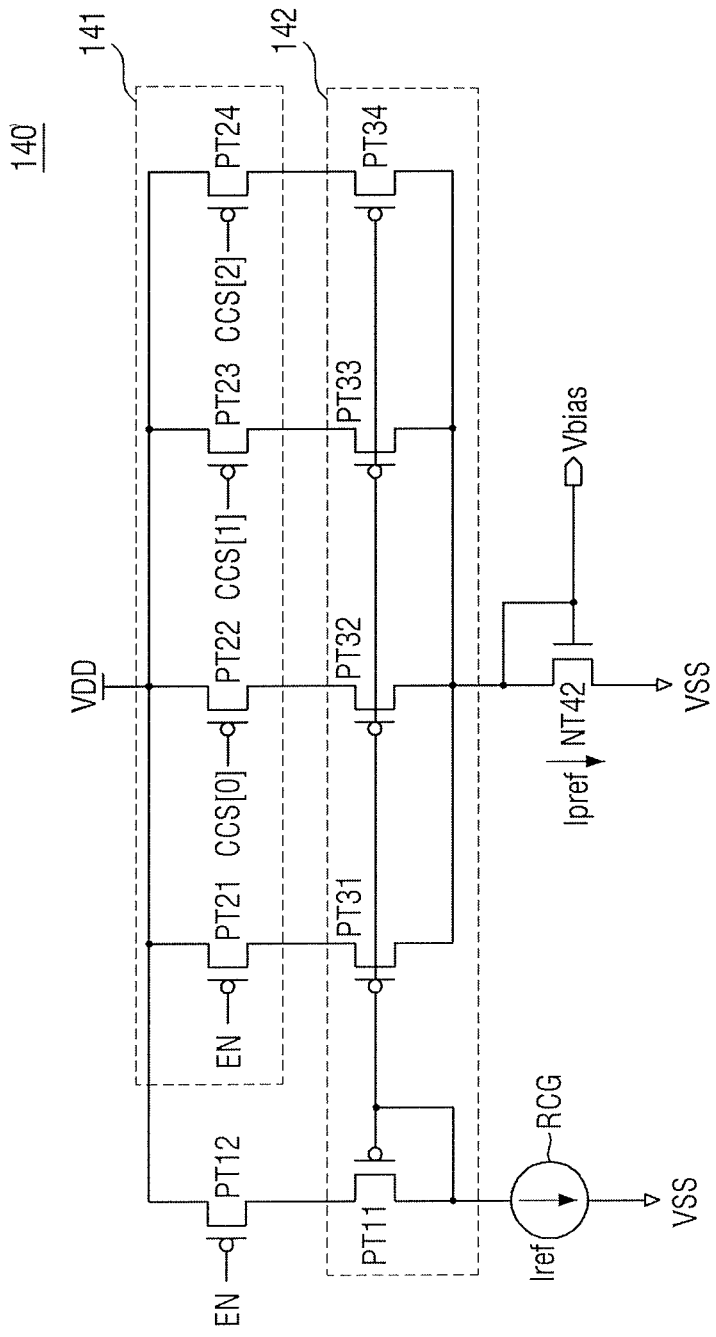
FIG. 10 illustrates a programming current controller according to some exemplary embodiments.

FIG. 10 illustrates a programming current controller according to some exemplary embodiments. Referring to FIG. 10, the programming current controller 140 may include a reference current source RCG, a current mirroring unit 142, a current controller 141, and a transistor NT42 for generating a bias voltage. Further, the programming current controller 140 may further include a transistor PT12 for determining whether to operate the programming current controller 140.

The transistor PT12 may receive an enable signal EN. For example, the enable signal EN may be a write enable signal. When the enable signal EN is activated (e.g., logic low), the programming current controller 140 may be operated. The reference current source RCG may generate a reference current Iref. The current mirroring unit 142 may perform a mirroring operation of the reference current Iref. Thus, a current, which is same as or proportional to the reference current Iref, may flow in each of the transistors PT31, PT32, PT33, and PT34.

The transistors PT21, PT22, PT23, and PT24 of the current controller 141 may receive the enable signal (EN) and the current control signals (CCS[2:0]). According to the enable signal (EN) and the current control signals (CCS[2: 0]), the transistors PT21, PT22, PT23, and PT24 may be turned on or turned off. At least some of transistors may be turned on among the transistors PT21, PT22, PT23, and PT24. Thus, a current proportional to the reference current Iref may flow in a corresponding transistor to some transistors, which are turned on, among the transistors PT31, PT32, PT33, and PT34. Thus, a programming reference current Ipref may be modified according to the current control signals (CCS[2:0]).

The bias voltage (Vbias) may be generated based on the programming reference current Ipref flowing in the transistor NT42. As the current driving capability of the programming reference current Ipref increases, a voltage level of the bias voltage (Vbias) may be increased. As the current driving capability of the programming reference current Ipref decreases, the voltage level of the bias voltage (Vbias) may be lowered. Thus, the voltage level of the bias voltage (Vbias) may be determined according to the current control signals (CCS[2:0]). Further, as explained above with reference to FIG. 10, the programming current controller 140 according to an example embodiment may adjust a voltage level of the bias voltage (Vbias) through controlling of a digital method based on the current control signals (CCS[2:0]).

Figure 11:
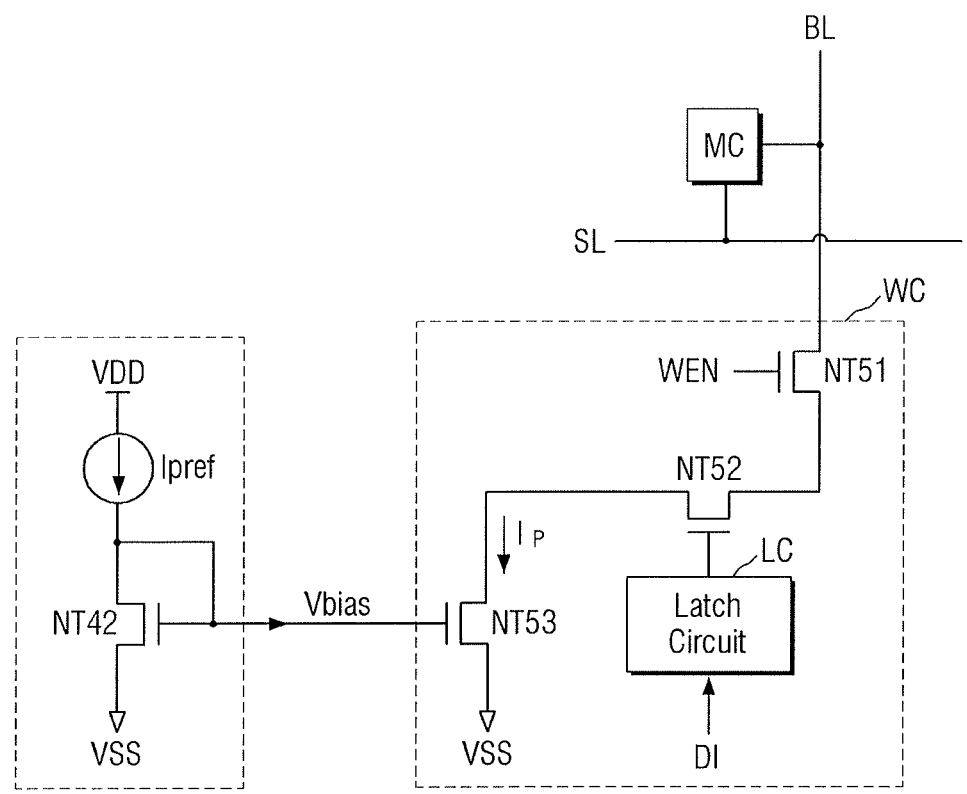
FIG. 11 illustrates a write circuit according to some exemplary embodiments.

FIG. 11 illustrates a write circuit according to some exemplary embodiments. Referring to FIG. 11, the write circuit WC may include a plurality of transistors NT51, NT52, and NT53 and a latch circuit LC. A plurality of transistors NT51, NT52, and NT53 may be connected with the bit lines through the column decoder 160.

When the write enable signal EN is activated, the transistor NT51 may be turned on. Further, when the transistor NT52 is turned on in response to an output of the latch circuit LC, the transistor NT53 may provide the programming current Ip to the bit line BL. The programming current Ip may flow to the bit line BL from the source line SL through the memory cell MC. Thus, the memory cell MC may be programmed by the programming current Ip. The current driving capability of the programming current Ip may be adjusted according to the voltage level of the bias voltage (Vbias). The programming current Ip may be outputted from the high voltage generator 131 for supplying the high voltage HV to the source line SL.

The latch circuit LC may output a gate voltage so that the transistor NT52 may be turned on selectively according to a logic level of the input data (DI). For example, when the logic level of the input data (DI) is "1", the memory cell MC may be programmed by turning on the transistor NT52. Further, when the logic level of the input data (DI) is "0", the programming operation of the memory cell MC may be stopped by turning off the transistor NT52.

Figure 12:
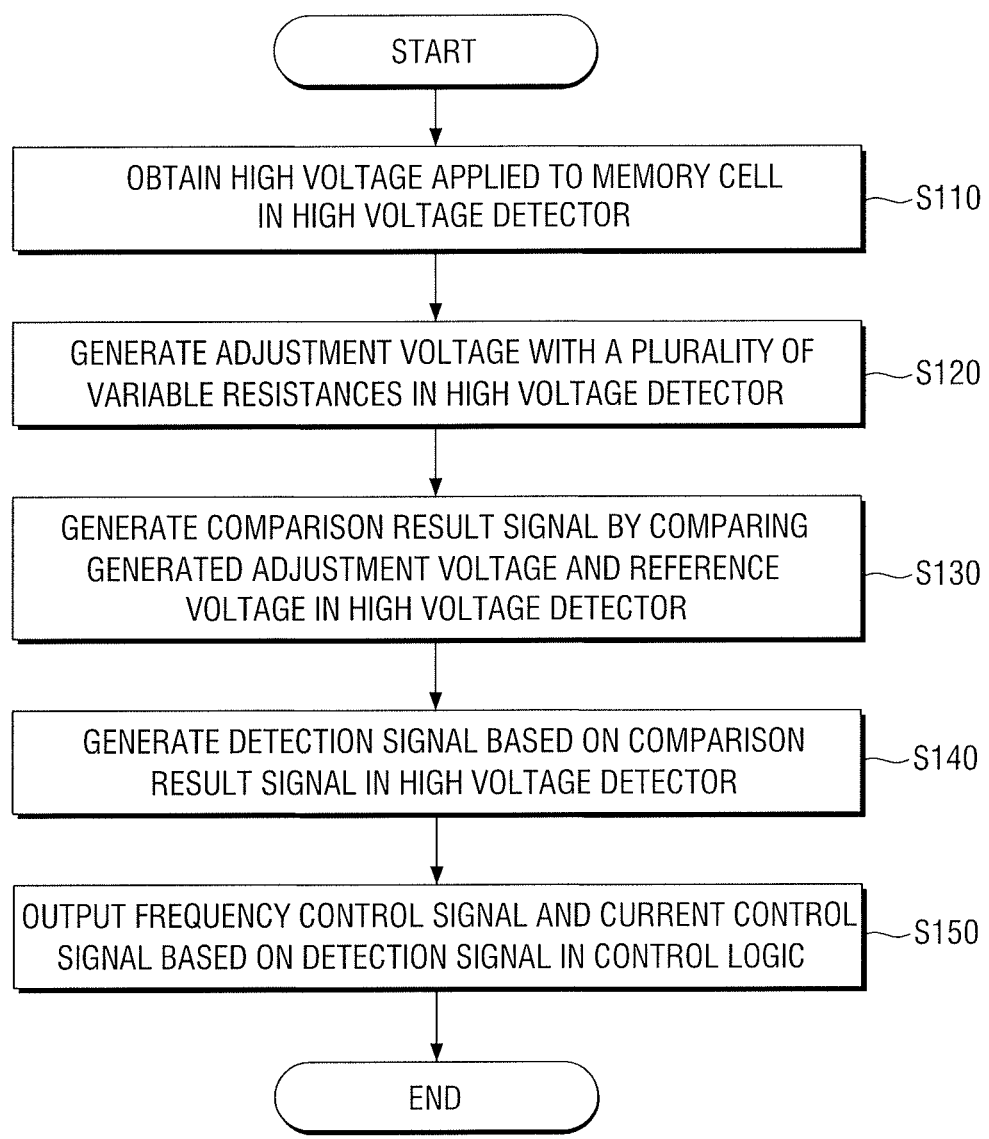
FIG. 12 illustrates a flowchart provided to explain a programming operation of a memory cell according to some exemplary embodiments.

FIG. 12 illustrates a flowchart for explaining a programming operation of a memory cell according to some exemplary embodiments. FIGS. 13 to 17 illustrate waveforms of control signals for generating a high voltage with respect to a nonvolatile memory device according to some exemplary embodiments.

For example, with reference to FIGS. 2, 3, 12, and 13, it will be exemplarily described adjusting frequency control signals (FCS) and current control signals (CCS) based on detection signals (DET) outputted from the high voltage detector 133 in FIG. 2 or 133A in FIG. 3 during a programming period, and accordingly, adjusting frequency of pumping clock (PCLK) and a current driving capability of programming current Ip according to some exemplary embodiments.

In operation S110, the high voltage detector 133 in FIG. 2 or 133A in FIG. 3 may obtain high voltage HV applied to the memory cell array 110 through the row decoder 150. The high voltage generator 131 may generate the high voltage HV for applying the programming current Ip to the selected memory cell of the memory cell array 110 in a programming period Tpgm. For example, the high voltage detector 133A may obtain the high voltage HV in a programming period Tpgm between a first time point t1 and a fourth time point t4 in FIG. 13. Further, in order to explain state before the high voltage HV reaches to a target voltage, it may be assumed that the high voltage detector 133A obtains the high voltage HV in the step S110 in a period between the first time point t1 and a third time point t3.

In operation S120, the high voltage detector 133A may generate an adjustment voltage Va by using, e.g., a plurality of variable resistances R1 and R2 in FIG. 3 or 4. For example, the high voltage detector 133A may obtain the adjustment voltage Va from a voltage level VHV of the high voltage HV through a voltage divider according to a resistance ratio of the first and second variable resistances R1 and R2. For example, the adjustment voltage Va may be a voltage of a node between the first variable resistance R1 and the second variable resistance R2.

In operation S130, the high voltage detector 133A may compare the adjustment voltage Va and the reference voltage (VREF) and generate a comparison result signal (CMP_OUT). According to some exemplary embodiments, the comparison circuit 133_1 may compare the adjustment voltage Va and the reference voltage (VREF) and generate the comparison result signal (CMP_OUT). The reference voltage (VREF) may have a predefined voltage level and may be modified and applied in the programming period Tpgm (e.g., a period between the first time point t1 and the fourth time point t4). The reference voltage (VREF) may have a voltage level of the adjustment voltage Va for generating a voltage level of a target voltage as a voltage level VHV of the high voltage HV previously defined. For example, when a voltage level of a target voltage is 10 V and when a voltage level of the adjustment voltage Va corresponding to the high voltage HV is 5 V, the reference voltage (VREF) may be 5 V. For example, when the adjustment voltage is 5 V to generate the high voltage HV of 10V, the reference voltage (VREF) may be 5V.

In operation S140, the high voltage detector 133A may generate the detection signals (DET) based on the comparison result signal (CMP_OUT). According to some exemplary embodiments, the high voltage detector 133A may generate the comparison result signals (CMP_OUT) generated by the comparison circuit 133_1 as detection signals (DET). For example, when the adjustment voltage Va does not reach to the reference voltage (VREF), e.g., when the adjustment voltage Va is less than the reference voltage (VREF), the high voltage detector 133A may output the detection signals (DET) having a logic high level (e.g., "1"). Further, the detection signals (DET) may have a logic low level (e.g., "0") after a time point when the adjustment voltage Va is equal to the reference voltage (VREF).

Figure 13:
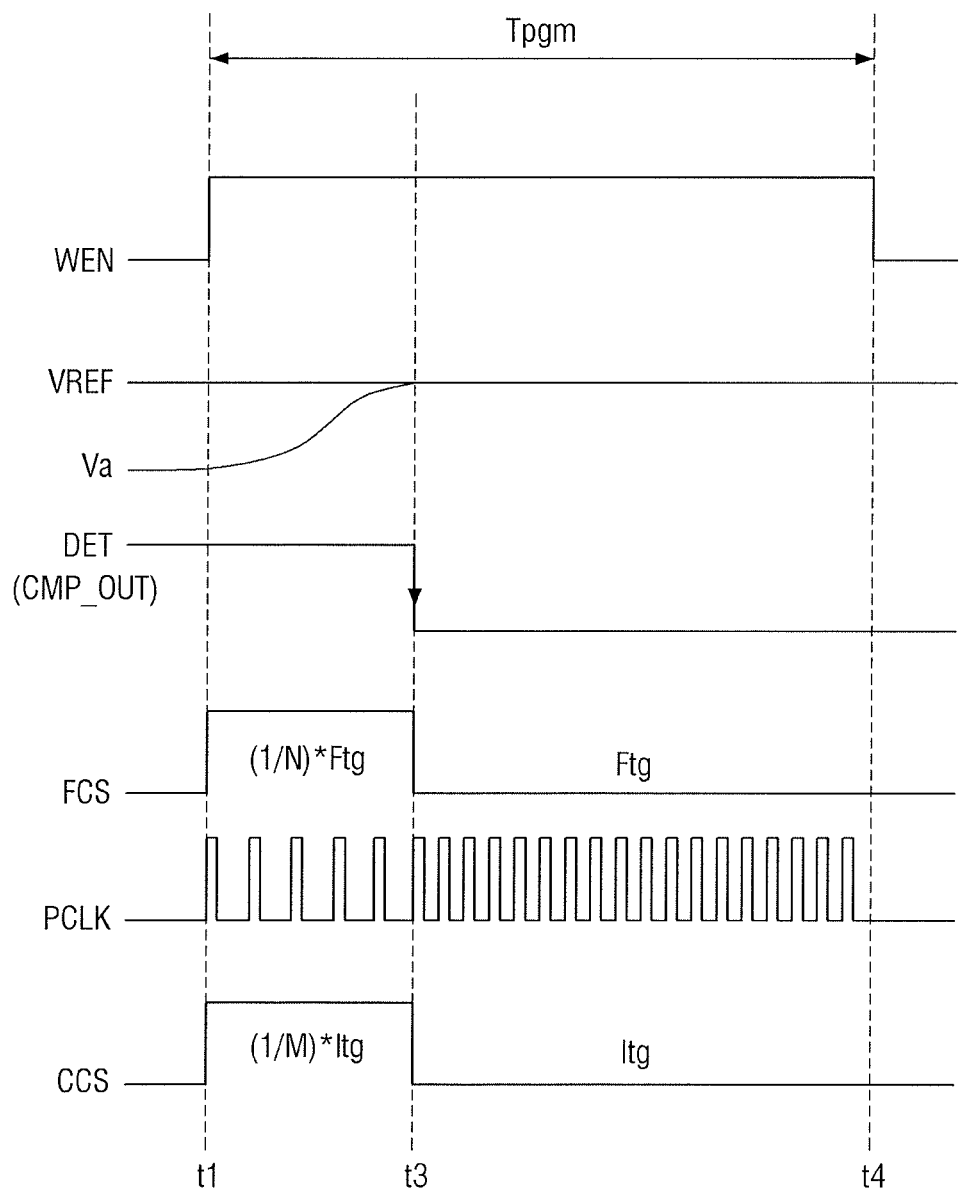
FIGS. 13 to 17 illustrate waveforms of control signals for generating a high voltage of a nonvolatile memory device according to some exemplary embodiments.

In operation S150, the control logic 120 may output the frequency control signals (FCS) and the current control signals (CCS) based on the detection signals (DET). Referring to FIG. 13, in the period between the first time point t1 and the third time point t3, the adjustment voltage Va may be less than a reference voltage (VREF). Thus, the comparison result signal (CMP_OUT) outputted as the detection signal (DET) may have a logic high level. For example, the control logic 120 may output the frequency control signals (FCS) to the pumping clock generator 132 to generate the pumping clock (PCLK). For example, the pumping clock (PCLK) generated by the pumping clock generator 132 may have a frequency corresponding to 1/N times (N is an integer equal to or more than 2) of a target frequency (Ftg). Thus, the pumping clock generator 132 may output the pumping clock (PCLK) having the frequency of 1/N times of the target frequency (Ftg) to the high voltage generator 131. The high voltage generator 131 may generate the high voltage HV based on the pumping clock (PCLK). Thus, the high voltage HV may be outputted as a voltage having a voltage level less than a target voltage because the frequency of the pumping clock (PCLK) in the period between the first time point t1 and the third time point t3 is lower than the target frequency (Ftg).

For example, in a period when the detection signal (DET) has a logic high level, the control logic 120 may output the current control signals (CCS) to the programming current controller 140. The programming current Ip may be adjusted to have a current driving capability corresponding to 1/M times (M is an integer equal to or more than 2) of a target current capability (Itg) according to the current control signals (CCS). Thus, the programming current controller 140 may output the bias voltage (Vbias) to a buffer circuit 170, i.e., the write circuit WC, so that the programming current Ip may be a current driving capability which is 1/M of a target current capability (Itg).

At a third time point t3, the adjustment voltage Va may have a same level as the reference voltage (VREF). For example, the high voltage HV applied to the memory cell array 110 may reach to the target voltage level.

In a period between a third time point t3 and a fourth time point t4, the comparison result signal (CMP_OUT) outputted from the high voltage detector 133A as the detection signals (DET) may have a logic low level. When the detection signal (DET) has a logic low level, the control logic 120 may output the frequency control signals (FCS) to the pumping clock generator 132. Thus, the pumping clock (PCLK) may have the target frequency (Ftg) according to the frequency control signals (FCS). Thus, the pumping clock generator 132 may output the pumping clock (PCLK) with the target frequency (Ftg) to the high voltage generator 131. The high voltage generator 131 may generate the high voltage HV having a voltage level of a target voltage by the pumping clock (PCLK) with the target frequency (Ftg).

For example, in a period where the detection signal (DET) has a logic low level, the control logic 120 may output the current control signals (CCS) to the programming current controller 140 so that the programming current Ip may be adjusted to have a target current capability (Itg). Thus, the programming current controller 140 may output the bias voltage (Vbias) to the buffer circuit 170, i.e., the write circuit WC, so that a current driving capability of the programming current Ip may be a target current capability (Itg). Accordingly, a normal programming operation may be performed in the period between the third time point t3 and the fourth time point t4.

Figure 14:
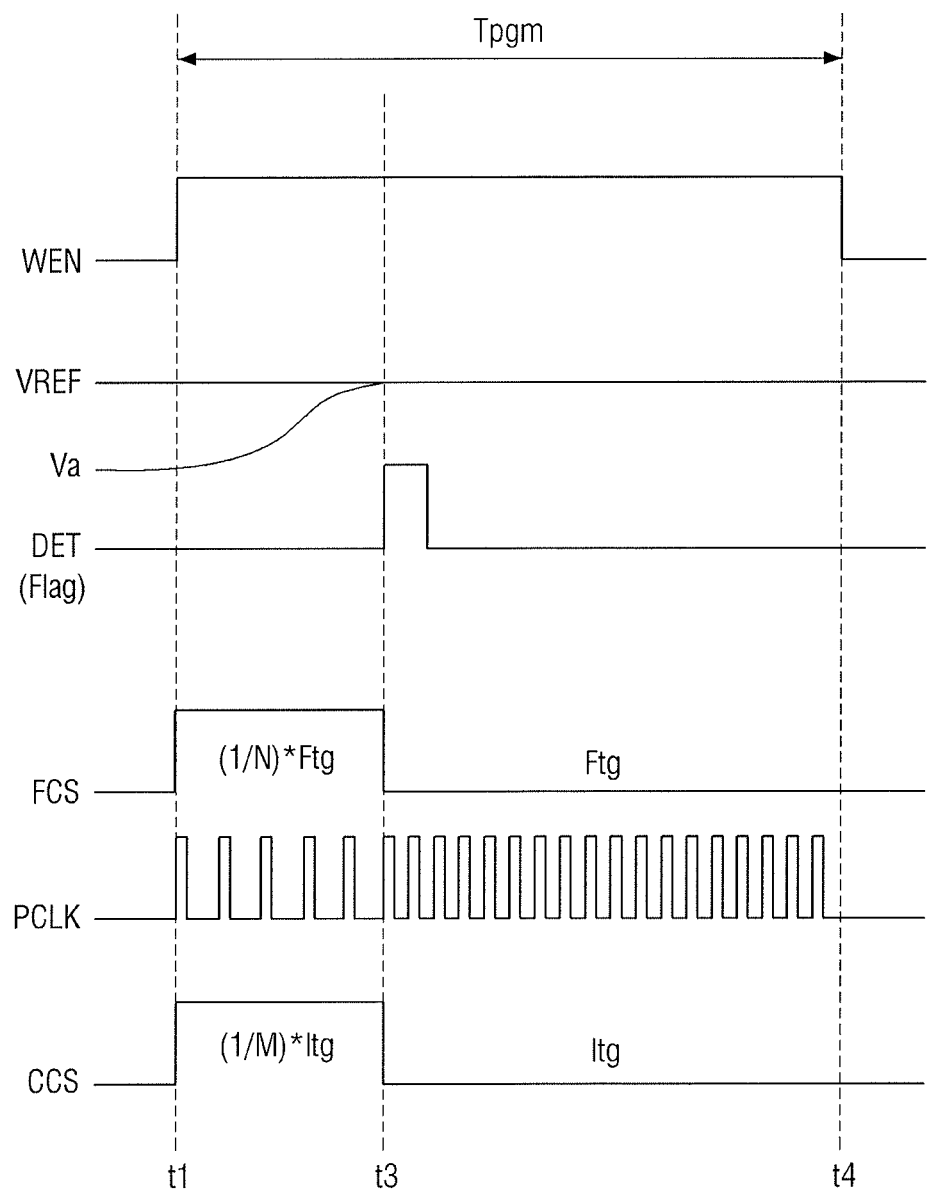

Referring to FIGS. 2, 4, and 14, the high voltage detector 133 according to some exemplary embodiments may output the detection signals (DET) to the control logic 120 in a flag signal. Hereinbelow, difference from the programming operation of the nonvolatile memory device 100 described above with reference to FIG. 13 will be highlighted.

As illustrated in FIG. 4, the high voltage detector 133B according to some exemplary embodiments may further include a flag generator 133_2. For example, when a flag signal (Flag) outputted as detection signal (DET) has a logic high level, the flag signal (Flag) may include information indicating that the adjustment voltage Va reaches to the reference voltage (VREF). Thus, the control logic 120 may output the frequency control signals (FCS) to the pumping clock generator so that the pumping clock (PCLK) is outputted as target frequency (Ftg) after the third time point t3 at which the detection signal (DET) with a logic high level is received. Further, the control logic 120 may output the current control signals (CCS) to the programming current controller 140 so that current driving capability of the programming current Ip is adjusted to have the target current capability (Itg) after the third time point t3.

Figure 15:
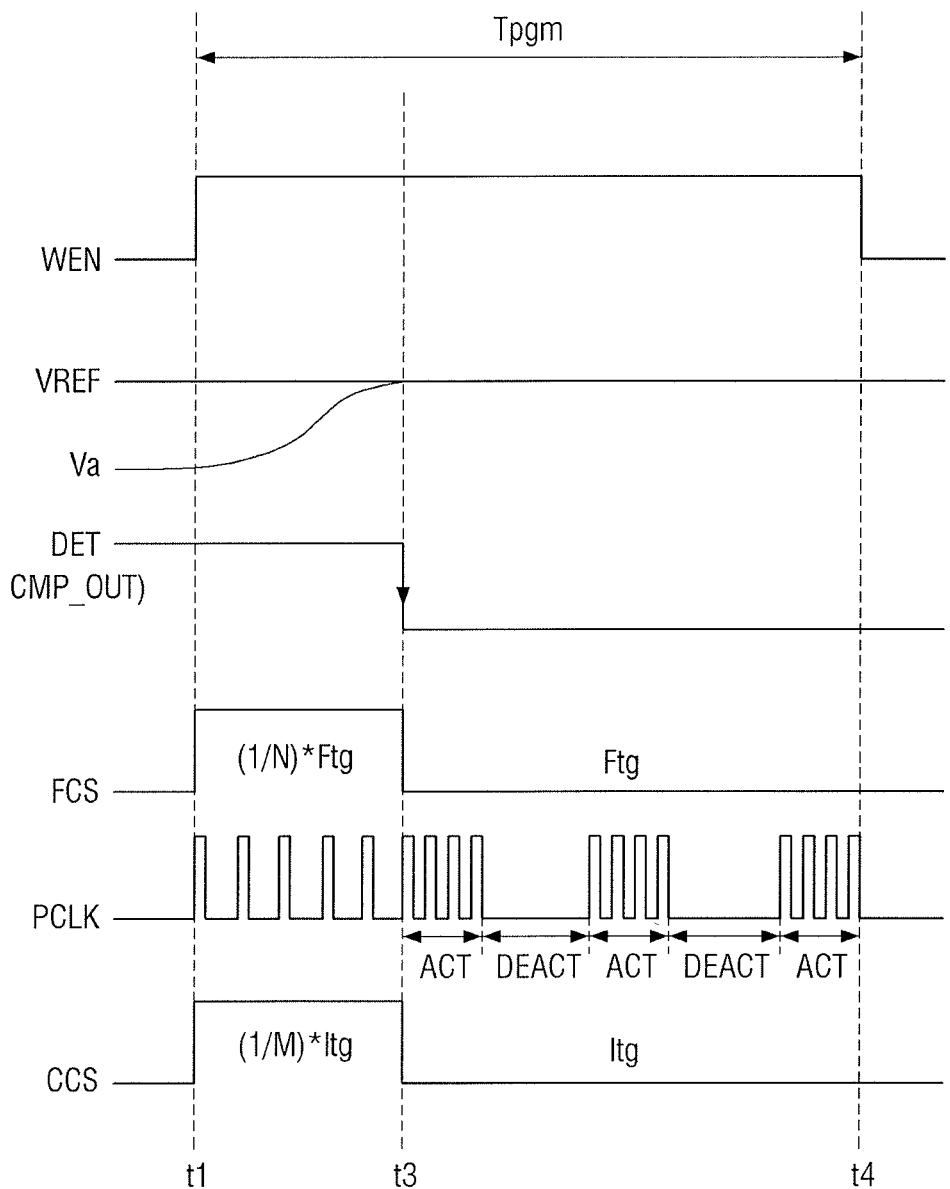

Referring to FIG. 15, the control logic 120 may control an inactivated period (DEACT) for which the pumping clock generator 132 does not output pumping clock (PCLK) after the high voltage HV reaches to the target voltage. For example, in a period from the third time point t3 and the fourth time point t4 as a programming period Tpgm (e.g., after the high voltage HV reaches to a target voltage), an activated period (ACT) and the inactivated period (DEACT) may be alternately repeated. The activated period (ACT) may be a period in which the pumping clock (PCLK) is outputted as target frequency (Ftg) to the high voltage generator 131. The inactivated period (DEACT) may be a period in which the pumping clock (PCLK) is not outputted to the high voltage generator 131.

According to an embodiment, because the high voltage HV has a voltage level corresponding to the target frequency (Ftg) after the high voltage HV reaches to a target voltage, it is efficient to fix and output a voltage level of the high voltage HV, electrical consumption may be saved if the pumping clock (PCLK) is not outputted until the programming period Tpgm ends. Further, because a voltage level of the high voltage HV may be modified due to noises, coupling or the like that can occur in the high voltage generator 131, the activated period (ACT) and the inactivated period (DEACT) may be alternately outputted.

Figure 16:
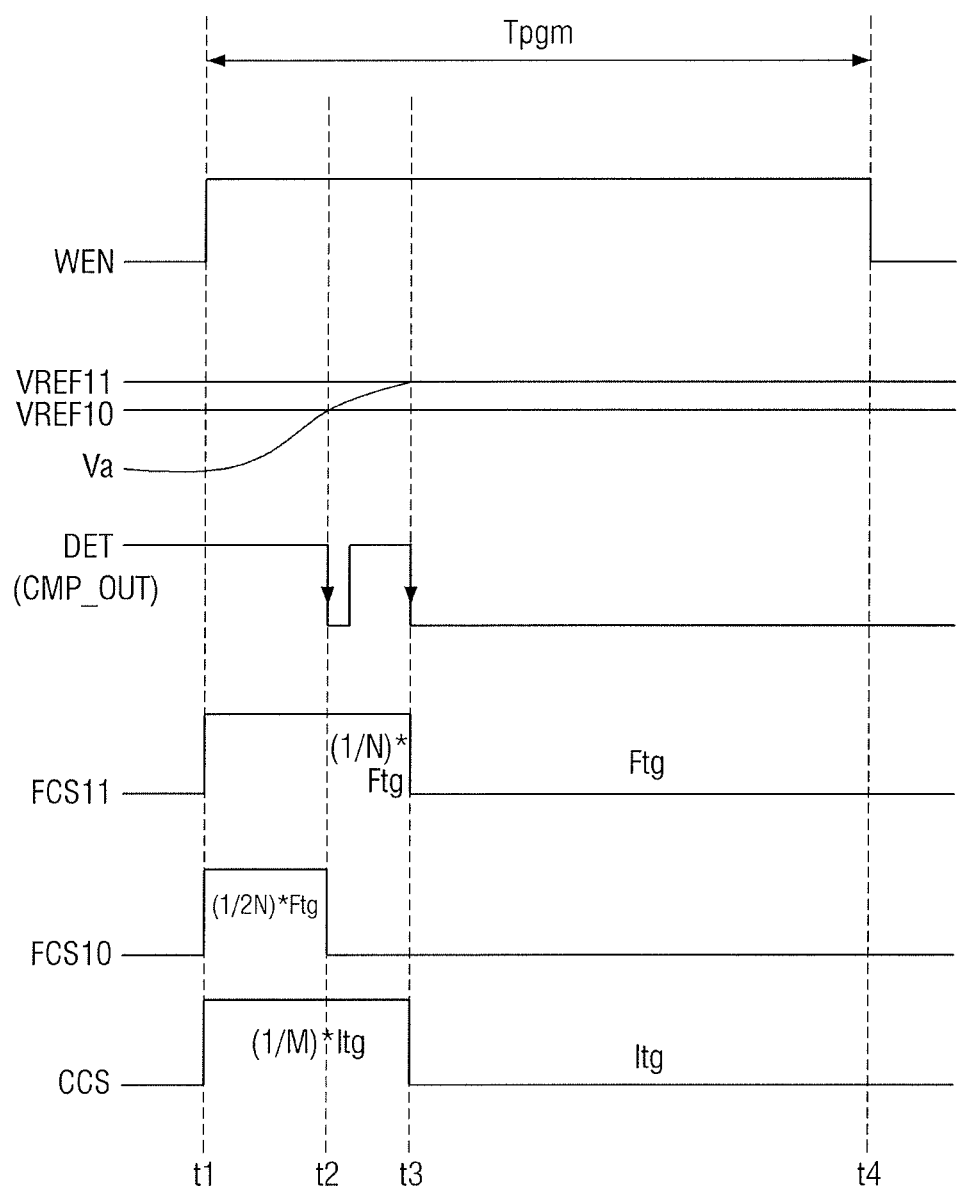

Referring to FIGS. 2, 3, and 16, in a programming operation of the nonvolatile memory device 100 according to an exemplary embodiment, frequency of the pumping clock (PCLK) may be implemented to be applied as three or more different frequencies from one another according to a period, and the high voltage HV having three or more levels may be applied to the memory cell. Hereinbelow, difference from the operation described above with reference to FIG. 13 will be highlighted.

According to some exemplary embodiments, the reference voltage (VREF) of the high voltage detector 133 may be modified during the programming operation. Referring to FIG. 16, from a first time point t1 as a starting time point, i.e., from a time point when the write activation signal (WEN) is activated, a first reference voltage VREF10 may be applied to the comparison circuit 133_1 of the high voltage detector 133. Thereafter, at a time point when the adjustment voltage Va is same as the first reference voltage VREF10 (e.g., a second time point t2), the detection signal (DET) may be converted into a logic low level.

The control logic 120 may output the frequency control signals (FCS) to the pumping clock generator 132 so that the pumping clock (PCLK) may be outputted and have a frequency corresponding to ½N times (N is an integer equal to or more than 2) of the target frequency (Ftg) in a period from the first time point t1 (i.e., when the programming period Tpgm starts) to the second time point t2 (i.e., when the detection signal (DET) is converted into a logic low level). Thereafter, the control logic 120 may output the frequency control signals (FCS) to the pumping clock generator 132 so that the pumping clock (PCLK) is outputted and have a frequency corresponding to 1/N times of a target frequency (Ftg) in a period from the second time point t2 to a third time point t3 (i.e., when the detection signal (DET) is converted secondly into a logic low level).

After a time point when the adjustment voltage Va is the same as a first reference voltage VREF10, a second reference voltage VREF11 may be applied to the comparison circuit 133_1. For example, an input voltage of the comparison circuit 133_1 may be modified from the first reference voltage VREF10 to the second reference voltage VREF11. A voltage level of the second reference voltage VREF11 may be higher than a voltage level of the first reference voltage VREF10. According to some exemplary embodiments, the second reference voltage VREF11 may correspond to the reference voltage (VREF) of FIG. 13. For example, the second reference voltage VREF11 may be a voltage level of the adjustment voltage Va for generating the high voltage HV with the target voltage.

A third time point t3 when the detection signal (DET) is converted secondly into a logic low level may be a time point when a voltage level VHV of the high voltage HV is same as a target voltage. Thus, the control logic 120 may output the frequency control signals (FCS) to the pumping clock generator 132 so that the pumping clock (PCLK) is generated to have a target frequency (Ftg).

Further, the control logic 120 may output the current control signals (CCS) to the programming current controller 140 so that the programming current Ip is adjusted to have a current driving capability corresponding to 1/M times (M is an integer equal to or more than 2) of a target current capability (Itg) from a first time point t1 (i.e., when the programming period Tpgm starts) to a third time point (i.e., when the detection signal (DET) is converted secondly into a logic low level), and output the current control signals (CCS) to the programming current controller 140 so that current driving capability of the programming current Ip is adjusted to have the target current capability (Itg) in a following period, i.e., in a period from a third time point t3 to a fourth time point t4.

According to some exemplary embodiments, the high voltage detector 133 may control the pumping clock (PCLK) to have three or more frequencies by using a plurality of reference voltages VREF10 and VREF11. Thus, a voltage level of the high voltage HV may be correctly considered. Therefore, an efficiency of a programming operation may be enhanced and an electrical power consumption may be minimized.

Figure 17:
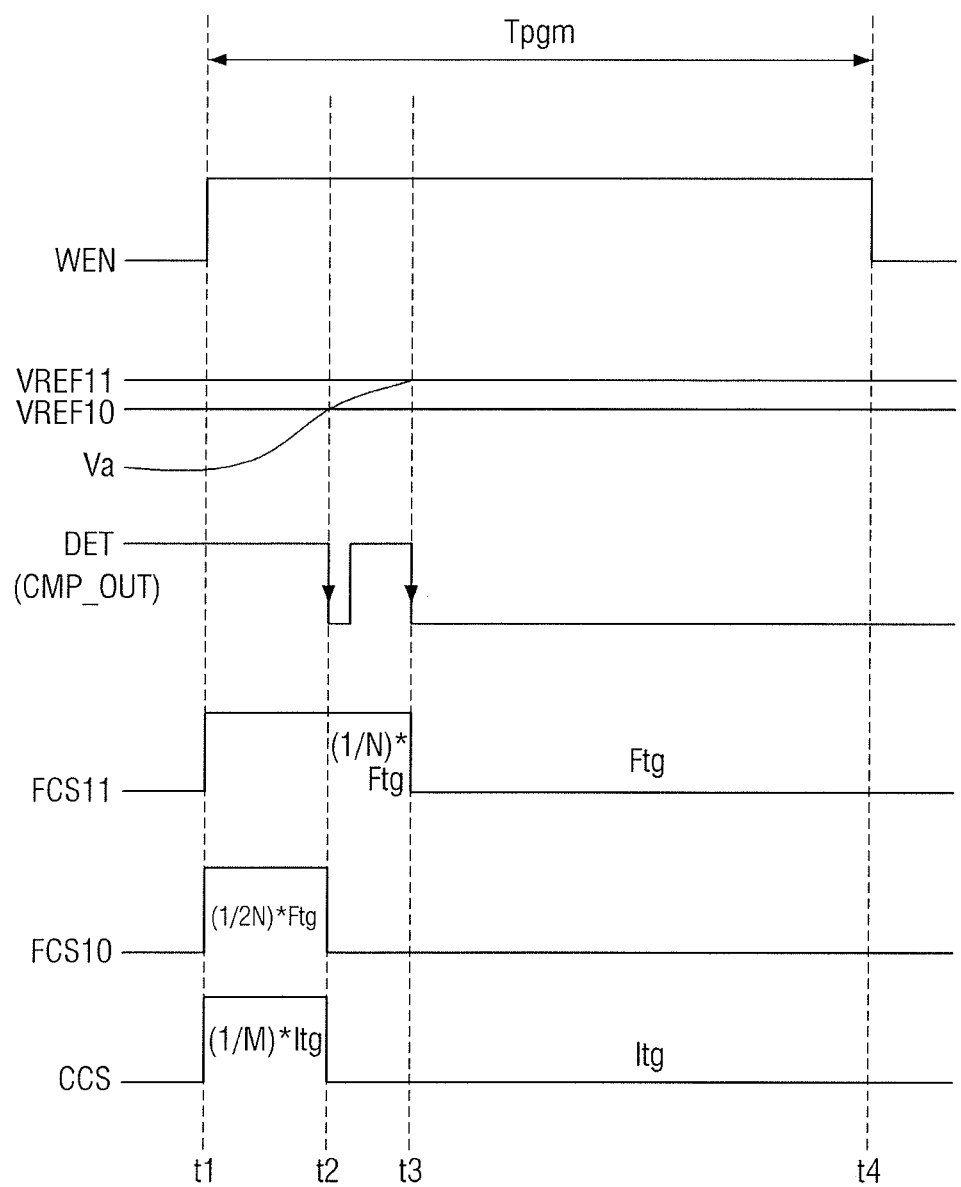

Referring to FIG. 17, differently from the described with reference to FIG. 16, the control logic 120 may output the current control signals (CCS) so that the programming current Ip is adjusted to have a current driving capability corresponding to 1/M times of a target current capability (Itg) from a first time point t1 (i.e., when the programming period Tpgm starts) to a second time point t2 (i.e., when a logic level of the detection signal (DET) is converted firstly into a logic low), and output the current control signals (CCS) so that a current driving capability of the programming current Ip is adjusted to have a target current capability (Itg) in a remained programming period. Further, the adjustment in a current driving capability of the programming current Ip may be changed according to a different period or a different number of a current driving capability.

Figure 18:
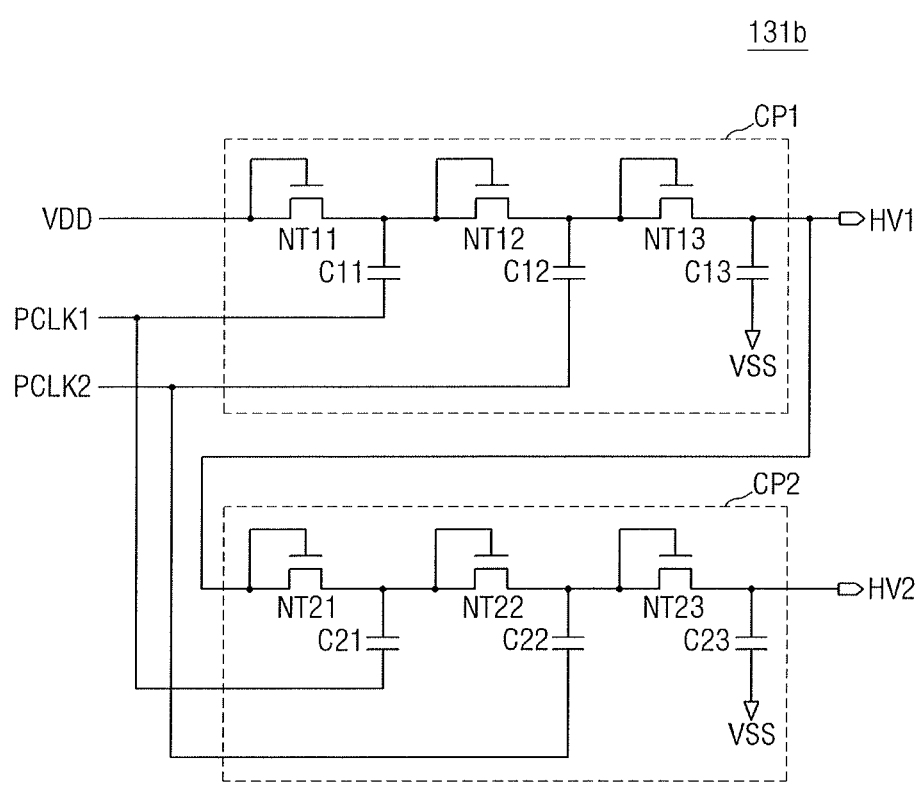
FIG. 18 illustrates a high voltage generator according to some exemplary embodiments.
Figure 19:
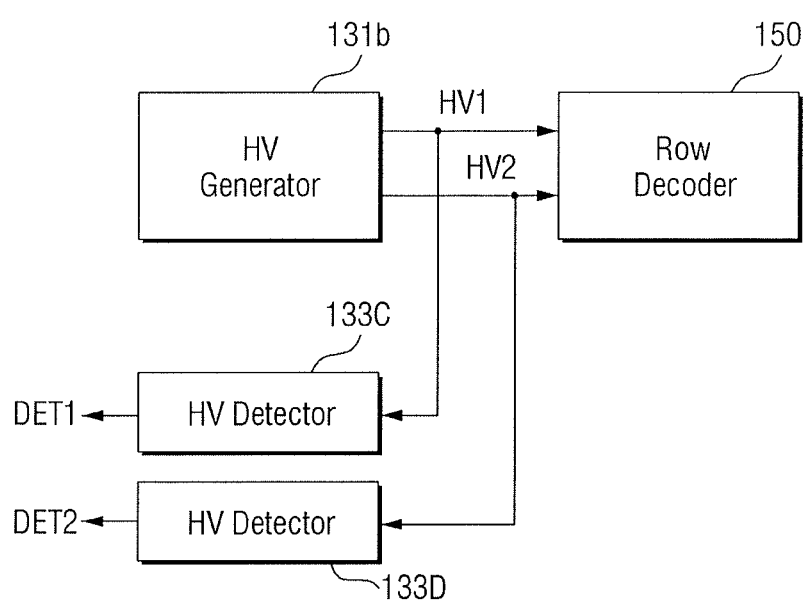
FIG. 19 illustrates an example for explaining an operation of a high voltage detector outputting detection signals with respect to a plurality of high voltages generated by the high voltage generator in FIG. 18.

FIG. 18 illustrates a high voltage generator according to some exemplary embodiments, and FIG. 19 illustrates a high voltage detector outputting detection signals with respect to a plurality of high voltages generated in the high voltage generator in FIG. 18.

Referring to FIG. 18, the high voltage generator 131b may generate a plurality of high voltages VH1 and VH2. The high voltage generator 131b may include a first charge pump CP1 generating a first high voltage VH1 and a second charge pump CP2 generating a second high voltage VH2. A voltage level of the second high voltage VH2 may be higher than a voltage level of the first high voltage VH1. A structure and an operating operation of the first charge pump CP1 and the second high voltage VH2 will not be described in detail since they are similar to the structure and the operating operation of the charge pump CP described above with reference FIG. 8. Meanwhile, although it is illustrated in FIG. 18 that the second high voltage VH2 is generated based on the first high voltage VH1. The second charge pump CP2 may receive the power voltage VDD and generate the second high voltage VH2.

Referring to FIG. 19, the voltage generation circuit 130 according to an embodiment may include a first high voltage detector 133C and a second high voltage detector 133D. The first high voltage detector 133C may receive the first high voltage HV1 outputted from the high voltage generator 131b and output a first detection signal DET1 based on the first high voltage HV1. The second high voltage detector 133D may receive the second high voltage HV2 outputted from the high voltage generator 131b and output the second detection signal DET2 based on the second high voltage HV2. The first and second high voltage detectors 133C and 133D may be implemented similarly to a structure and an operating operation of the high voltage detector 133 described above with reference to FIG. 3. Alternatively, the first and second high voltage detectors 133C and 133D may be implemented similarly to a structure and an operating operation of the high voltage detector 133B described above with reference to FIG. 4.

Figure 20:
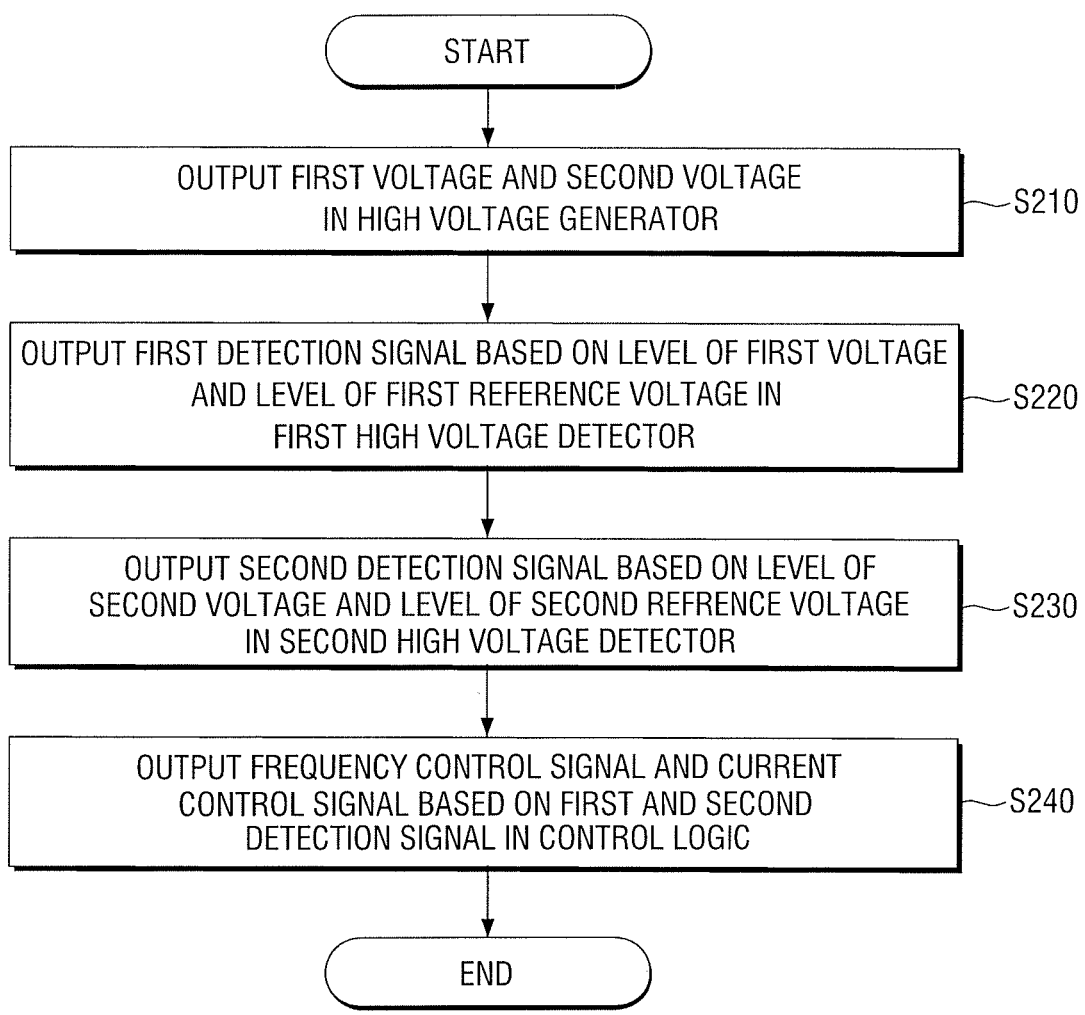
FIG. 20 illustrates a flowchart provided to explain a programming operation of a memory cell according to some exemplary embodiments.
Figure 21:
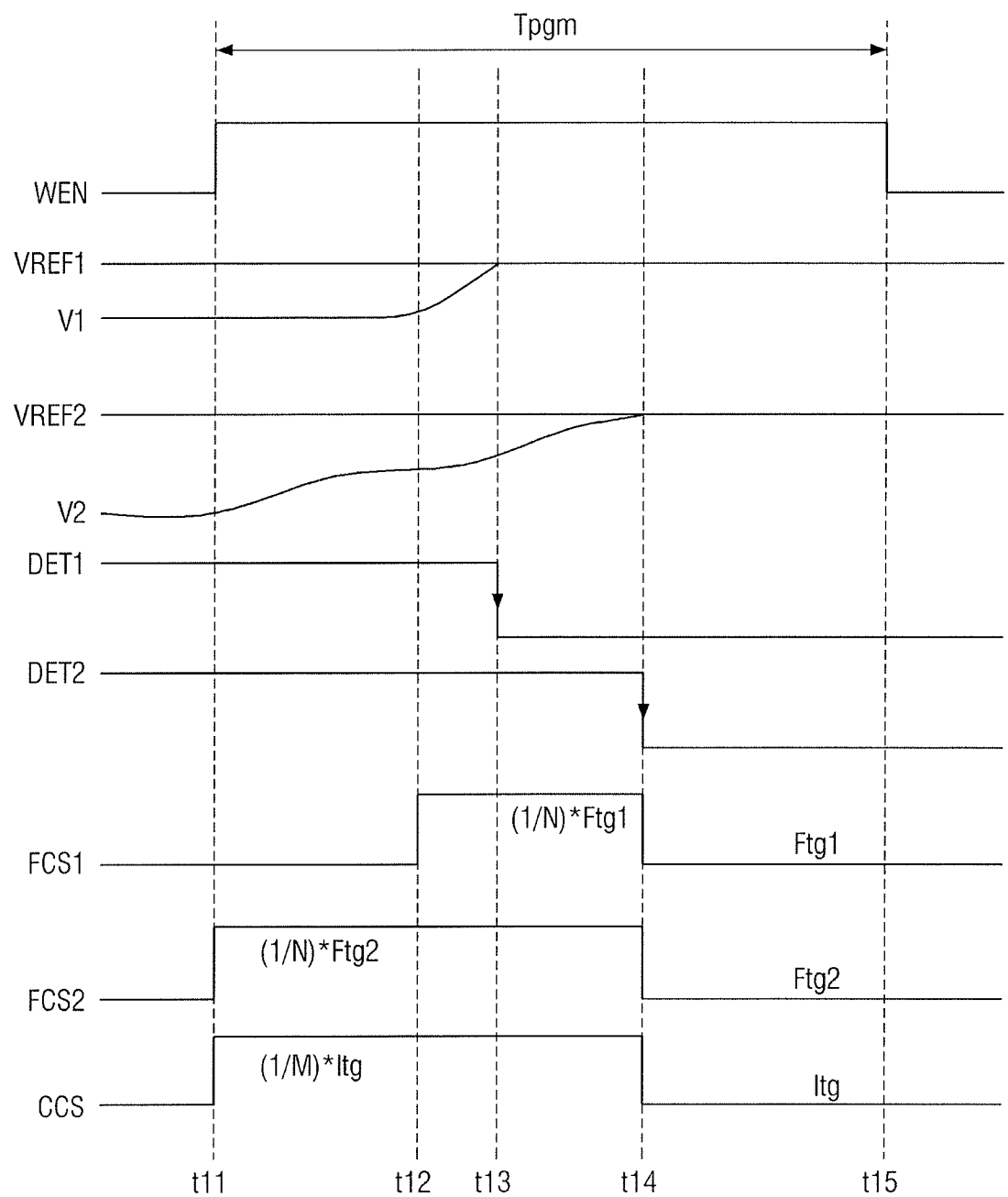
FIGS. 21 to 23 illustrate waveforms of control signals for generating a high voltage of a nonvolatile memory device according to some exemplary embodiments.
Figure 22:
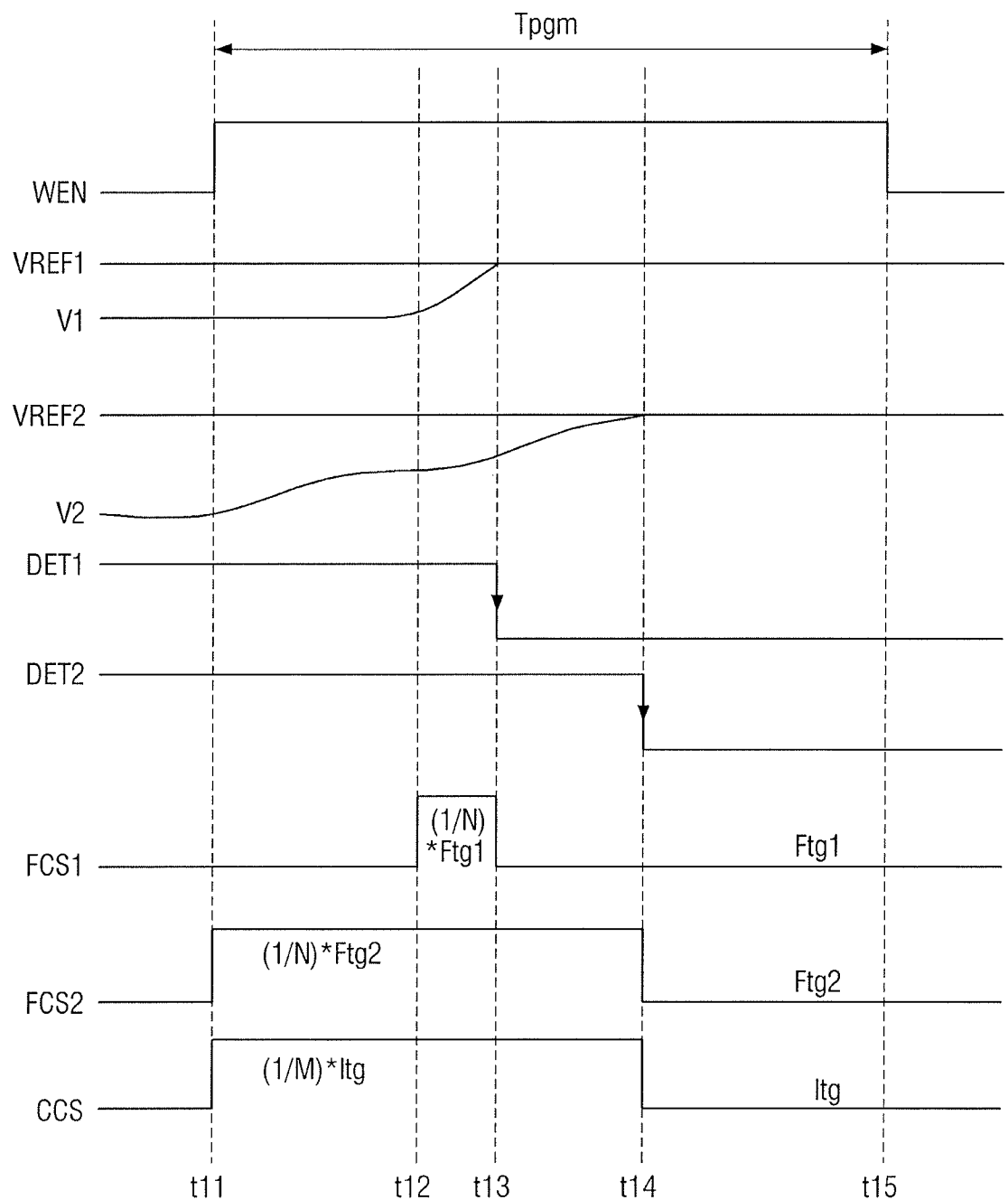
Figure 23:
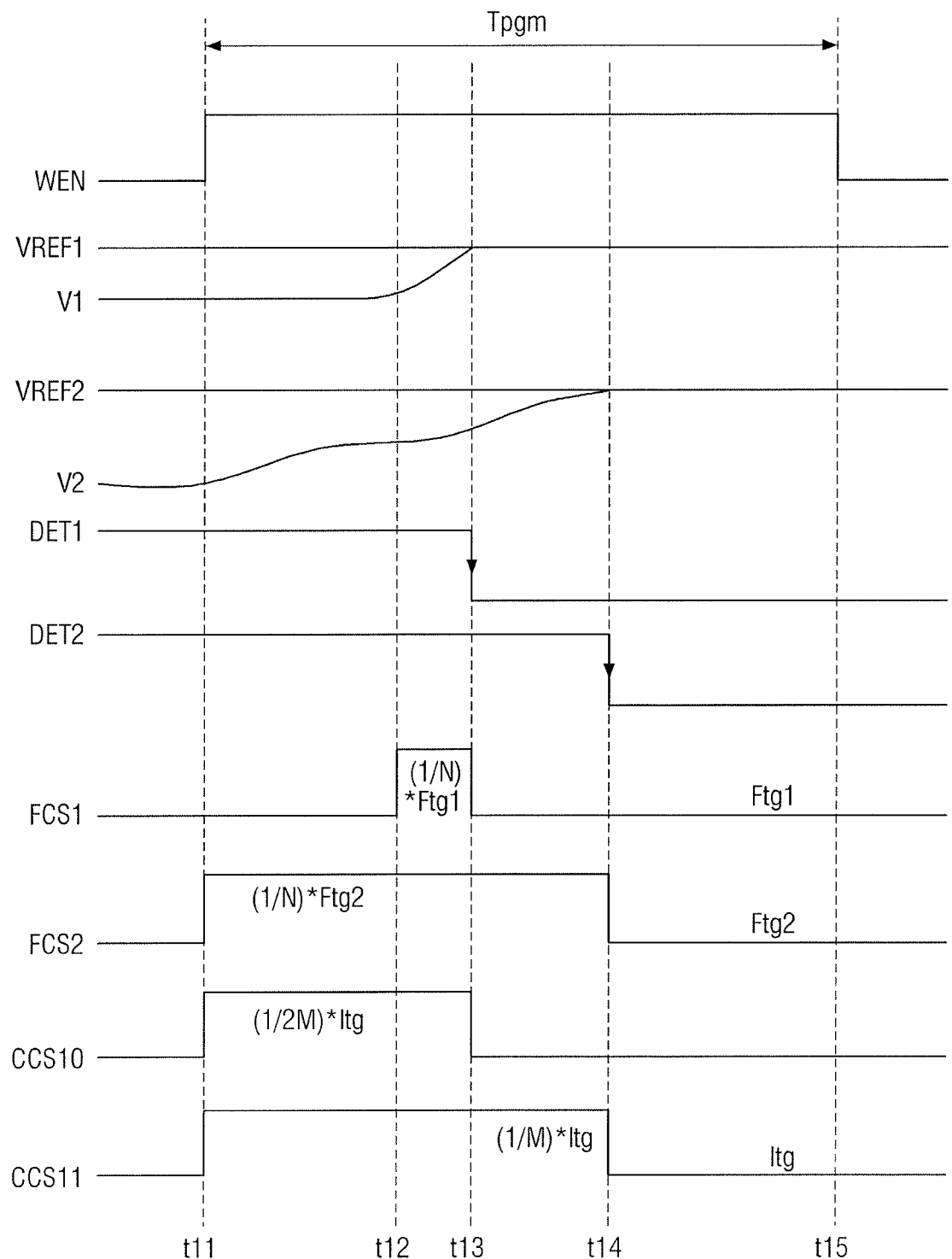

FIG. 20 illustrates a flowchart for explaining a programming operation of a memory cell according to some exemplary embodiments. FIGS. 21 to 23 illustrate control signals and waveforms of a high voltage with respect to a nonvolatile memory device according to some exemplary embodiments.

Hereinbelow, according to some exemplary embodiments with reference to FIGS. 2, 3, and 18 to 21, it will be exemplarily described adjusting the first frequency control signal FCS1, the second frequency control signal FCS2, and the current control signals (CCS) based on a plurality of detection signals DET1 and DET2 outputted from a plurality of high voltage detectors 133C and 133D in FIG. 10 during a programming period. Further, adjusting a frequency of the pumping clock (PCLK) and a current driving capability of programming current Ip will be described.

In a operation S210, the high voltage generator 131 may output a first voltage HV1 and a second voltage HV2. The pumping clock generator 132 may output a first pumping clock based on a first frequency control signal FCS1 outputted from the control logic 120. The high voltage generator 131 may generate the first voltage HV1 based on the first pumping clock. Thus, the pumping clock generator 132 may output a second pumping clock based on a second frequency control signal FCS2. The high voltage generator 131 may generate a second voltage HV2 based on the second pumping clock.

In operation S220, the first high voltage detector 133C in FIG. 19 may output a first detection signal DET1 based on a voltage level of the first voltage HV1 and a voltage level of a reference voltage VREF1. In operation S230, the second high voltage detector 133D may output a second detection signal DET2 based on a voltage level of the second voltage HV2 and a voltage level of a reference voltage VREF2. As outputting the first and second detection signals DET1 and DET2 respectively from the first and second high voltage detectors 133C and 133D is substantially performed to be similar to S120 to S140 described above with reference to FIG. 12.

In operation S240, the control logic 120 may output the first and second frequency control signals FCS1 and FCS2 and current control signals (CCS) based on the first and second detection signals DET1 and DET2. For example, the first frequency control signal FCS1 may be outputted from a time point t12 (i.e., when the first high voltage HV1 is generated and when the first adjustment voltage V1 is generated) to a time point t15 (i.e., when the programming period Tpgm ends). The second frequency control signal FCS2 may be outputted from a time point t11 (i.e., when the second high voltage HV2 is generated, when the second adjustment voltage V2 is generated, and when the programming period Tpgm starts) to a time point t15 (i.e., when the programming period Tpgm ends).

According to an embodiment, the control logic 120 may output the first frequency control signal FCS1 so that a frequency of the first pumping clock may be 1/N times of a first target frequency Ftg1 from a time point t12 (i.e., when the first high voltage HV1 is generated) to a time point t14 (i.e., when a second detection signal DET2 with respect to the second high voltage HV2 is converted). Further, a frequency of the first pumping clock may be a first target frequency Ftg1 from the time point t14 to a time point t15 (i.e., when the programming period Tpgm ends). Further, the control logic 120 may output the first frequency control signal FCS1 so that frequency of the second pumping clock may be 1/N times of a second target frequency Ftg2 from a time point t11 (i.e., when the second high voltage HV2 is generated) to a time point t14 (i.e., when the second detection signal DET2 with respect to the second high voltage HV2 is converted). Further, a frequency of the second pumping clock may be a second target frequency Ftg2 from the time point t14 to a time point t15. For example, the pumping clock generator 132 may be controlled so that the first pumping clock and the second pumping clock respectively have a first target frequency Ftg1 and a second target frequency Ftg2 after the first adjustment voltage V1 reaches to a reference voltage REF1 and the second adjustment voltage V2 reaches to a reference voltage REF2. Further, the control logic 120 may output the current control signals (CCS) to the programming current controller 140 so that the programming current Ip may have a current driving capability corresponding to 1/M times of a target current capability (Itg) from a time point t11 to a time point t14 (i.e., when the second adjustment voltage V2 reaches to a reference voltage REF2). Further, the programming current Ip may be a target current capability (Itg) after the time point t14 according to the current control signals (CCS).

Referring to FIG. 22, the control logic 120 may output the first frequency control signal FCS1 so that a frequency of the first pumping clock may be 1/N times of a first target frequency Ftg1 from a time point t12 (i.e., when the first high voltage HV1 is generated) to a time point t13 (i.e., when the first detection signal DET1 with respect to the first high voltage HV1 is converted). Further, a frequency of the first pumping clock may be a first target frequency Ftg1 from the time point t13 to a time point t15 (i.e., when the programming period Tpgm ends) according to the first frequency control signal FCS1. For example, the control logic 120 may independently control the first and second frequency control signals FCS1 and FCS2 according to a time point when each of the first and second detection signals DET1 and DET2 is converted, and accordingly, confirm a voltage level of the first and second high voltages HV1 and HV2, and provide efficient voltage.

Referring to FIG. 23, the control logic 120 may control the programming current controller 140 to adjust a current driving capability of the programming current Ip according to whether the first high voltage HV1 and the second high voltage HV2 reach to respective target voltages. For example, the control logic 120 may output the first current control signal CCS10 and the second current control signal CCS11 to the programming current controller 140. Thus, the first current control signal CCS10 may be outputted so that the programming current Ip may have a current driving capability corresponding to ½M times of a target current capability (Itg) to a time point t13 (i.e., when the first high voltage HV1 reaches) to a first target voltage. Further, the second current control signal may be outputted to the programming current controller 140 so that the programming current Ip may have a capability corresponding to 1/M times of a target current capability (Itg) from the time point t13 to a time point t14 (i.e., when the second high voltage HV2 reaches to a second target voltage). Further, the programming current Ip may be controlled to have a target current capability (Itg) after a time point t15 according to the second current control signal.

Various operations of methods described above may be performed as is suitable, such as by various hardware and/or software components, modules, and/or circuits. When implemented in software, the operations may be implemented using, for example, an ordered listing of executable instructions for implementing logical functions, and may be embodied in a processor-readable medium for use by or in connection with an instruction execution system, apparatus, or device, such as a single or multiple-core processor or processor-containing system.

By way of summation and review, a nonvolatile memory device or a memory system including the nonvolatile memory according to implementations may reduce a power consumption in a programming operation by adjusting a pumping clock frequency for generating a high voltage and a programming current capacity of the high voltage. A nonvolatile memory device or a memory system including the nonvolatile memory according to implementations may be enhanced in a programming operation characteristic by precisely determining whether a high voltage applied to a memory cell reaches to a target voltage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A nonvolatile memory device, comprising:
a memory cell array including a plurality of memory cells that are programmed based on a high voltage;
a high voltage generator to generate the high voltage by boosting an input voltage based on a pumping clock;
a pumping clock generator to generate the pumping clock;
a high voltage detector including a plurality of variable resistances connected to each other, the high voltage detector to generate a detection signal by comparing an adjustment voltage with a reference voltage, the adjustment voltage determined based on a resistance ratio of the plurality of variable resistances and the high voltage;
a programming current controller to adjust a programming current flowing through each of selected memory cells of the plurality of memory cells; and
a control logic to adjust a frequency of the pumping clock and a current driving capability of the programming current based on the detection signal during a programming period with respect to the selected memory cells, wherein:
the detection signal includes information indicating whether the high voltage reaches to a target voltage, and
the control logic controls the pumping clock generator such that the pumping clock has a frequency corresponding to ½N times (N is an integer equal to or more than 2) of a target frequency in a first period, has a frequency corresponding to 1/N times of the target frequency in a second period after the first period, and has the target frequency in a third period after the second period during the programming period.

2. The nonvolatile memory device as claimed in claim 1, wherein:
the control logic further includes a latch circuit to store a first detection signal generated at a time point when the high voltage reaches to the target voltage, and
the control logic adjusts the frequency of the pumping clock and the current driving capability of the programming current based on the detection signal outputted from the high voltage detector and the first detection signal stored in the latch circuit in a period after the first detection signal is stored in the latch circuit during the programming period.

3. The nonvolatile memory device as claimed in claim 1, wherein:
the high voltage detector outputs the detection signal as a 1-bit flag signal including information indicating whether the high voltage reaches to the target voltage, and
the control logic adjusts the frequency of the pumping clock and the current driving capability of the programming current based on the detection signal.

4. The nonvolatile memory device as claimed in claim 1, wherein:
the control logic controls the pumping clock generator such that the pumping clock generated by the pumping clock generator has a frequency corresponding to 1/N times (N is an integer equal to or more than 2) of a target frequency in the first period before the high voltage reaches to the target voltage, and controls the pumping clock generator such that the pumping clock generated by the pumping clock generator has the target frequency in the second period from a time point when the high voltage reaches to the target voltage to a time point when the programming period ends.

5. The nonvolatile memory device as claimed in claim 4, wherein:
the control logic controls the programming current controller such that the current driving capability of the programming current is adjusted to be 1/M times (M is an integer equal to or more than 2) of a target programming current capability in the first period, and the current driving capability of the programming current is adjusted to be the target programming current capability in the second period.

6. The nonvolatile memory device as claimed in claim 4, wherein:
the second period includes a plurality of activated periods and at least one of inactivated periods between the plurality of activated periods, and
the control logic controls the pumping clock generator such that the pumping clock is outputted only in the plurality of activated periods and is not outputted in the inactivated periods.

7. The nonvolatile memory device as claimed in claim 1, wherein:
the high voltage detector generates a first detection signal by comparing a first adjustment voltage with a first reference voltage, the first adjustment voltage determined based on a resistance ratio of first variable resistances and the high voltage, and generates a second detection signal by comparing a second adjustment voltage with a second reference voltage, the second adjustment voltage determined based on a resistance ratio of second variable resistances and the high voltage, and
the first period is before the first adjustment voltage reaches to the first reference voltage, and the second period is from a time point when the first adjustment voltage reaches to the first reference voltage to a time point when the second adjustment voltage reaches to the second reference voltage.

8. The nonvolatile memory device as claimed in claim 7, wherein:
the control logic controls the programming current controller such that the current driving capability of the programming current is adjusted to be ½M times (M is an integer equal to or more than 2) of a target programming current capability in the first period, is adjusted to be 1/M times of the target programming current capability in the second period, and is adjusted to be the target programming current capability in the third period.

9. The nonvolatile memory device as claimed in claim 1, wherein:
the high voltage detector includes three or more variable resistances and generates the adjustment voltage by voltage dividing the high voltage using three or more variable resistances.

10. A nonvolatile memory device, comprising:
a memory cell array including a plurality of memory cells that are programmed based on high voltage;
a voltage generation circuit to apply a first high voltage generated based on a first pumping clock and a second high voltage generated based on a second pumping clock to selected memory cells among the plurality of memory cells, to output a first detection signal based on voltage levels of the first high voltage and a first reference voltage, and to output a second detection signal based on voltage levels of the second high voltage and a second reference voltage;
a programming current controller to adjust a programming current flowing through each of the selected memory cells; and
a control logic to adjust a frequency of each of the first and second pumping clocks and a current driving capability of the programming current based on the first and second detection signals during a programming period, wherein:
the control logic controls the programming current controller such that the current driving capability of the programming current is adjusted to be ½M times (M is an integer equal to or more than 2) of a target programming current capability in a period before a first time point, the current driving capability of the programming current is adjusted to be 1/M times of the target programming current capability in a period from the first time point to a second time point that is later than the first time point, and the current driving capability of the programming current is adjusted to be the target programming current capability from the second time point.

11. The nonvolatile memory device as claimed in claim 10, wherein:
the first detection signal includes information indicating whether the first high voltage reaches to a first target voltage, and
the second detection signal includes information indicating whether the second high voltage reaches to a second target voltage.

12. The nonvolatile memory device as claimed in claim 10, the voltage generation circuit includes:
a first high voltage detector including a plurality of first variable resistances connected to each other, the first high voltage detector to generate the first detection signal by comparing a first adjustment voltage with the first reference voltage, the first adjustment voltage determined based on a resistance ratio of the first variable resistances and the first high voltage, and
a second high voltage detector including a plurality of second variable resistances connected to each other, the second high voltage detector to generate the second detection signal by comparing a second adjustment voltage with the second reference voltage, the second adjustment voltage determined based on a resistance ratio of the second variable resistances and the second high voltage.

13. The nonvolatile memory device as claimed in claim 12, wherein:
the first high voltage detector converts and outputs a logic level of the first detection signal from the first time point when the first adjustment voltage is equal to the first reference voltage, and
the second high voltage detector converts and outputs a logic level of the second detection signal from the second time point when the second adjustment voltage is equal to the second reference voltage.

14. The nonvolatile memory device as claimed in claim 13, wherein:
the second time point is later than the first time point, and
the control logic controls the voltage generation circuit such that the first and second pumping clocks generated by the voltage generation circuit have frequencies corresponding to 1/N times (N is an integer equal to or more than 2) of first and second target frequencies, respectively, in a period before the second time point, and the first and second pumping clocks have the first and second target frequencies, respectively, from the second time point.

15. The nonvolatile memory device as claimed in claim 13, wherein:
the control logic controls the voltage generation circuit such that the first pumping clock generated by the voltage generation circuit has a frequency corresponding to 1/N times (N is an integer equal to or more than 2) of a first target frequency in a period before the first time point, the first pumping clock has the first target frequency from the first time point, the second pumping clock generated by the voltage generation circuit has a frequency corresponding to 1/N times of a second target frequency in a period before the second time point, and the second pumping clock has the second target frequency from the second time point.

16. A memory system, comprising:
a nonvolatile memory device including a memory cell array, the memory cell array including a plurality of memory cells that are programmed based on a high voltage; and
a controller to control a programming operation of the nonvolatile memory device, wherein the nonvolatile memory device includes:
a high voltage generator to generate the high voltage by boosting an input voltage based on a pumping clock;
a high voltage detector including a plurality of variable resistances connected to each other, the high voltage detector to generate a detection signal by comparing an adjustment voltage with a reference voltage, the adjustment voltage determined based on a resistance ratio of the variable resistances and the high voltage;
a programming current controller to generate a program bias voltage for adjusting a programming current flowing through each of selected memory cells among the plurality of memory cells; and
a control logic to adjust the pumping clock and the program bias voltage, wherein:
the controller controls the control logic to modify a frequency of the pumping clock and a current driving capability of the programming current when the detection signal includes information indicating whether the adjustment voltage is equal to the reference voltage in a programming period,
the controller controls the control logic such that the pumping clock has a frequency corresponding to ½N times (N is an integer equal to or more than 2) of a target frequency in a first period,
the pumping clock has a frequency corresponding to 1/N times of the target frequency in a second period after the first period, and
the pumping clock has the target frequency in a third period after the second period during the programming period.

17. The memory system as claimed in claim 16, wherein:
the high voltage detector outputs the detection signal as a 1-bit flag signal including information indicating whether the high voltage reaches to a target voltage, and
the controller controls the control logic such that the frequency of the pumping clock and the current driving capability of the programming current are adjusted based on the detection signal.

18. The memory system as claimed in claim 16, wherein:
the high voltage detector generates a first detection signal by comparing a first adjustment voltage with a first reference voltage, the first adjustment voltage determined based on a voltage ratio of first variable resistances and a first high voltage, and generates a second detection signal by comparing a second adjustment voltage with a second reference voltage, the second adjustment voltage determined based on a voltage ratio of second variable resistances and a second high voltage,
the first period is before the first adjustment voltage reaches to the first reference voltage, and
the second period is from a time point when the first adjustment voltage reaches to the first reference voltage to a time point when the second adjustment voltage reaches to the second reference voltage.

* * * * *